United States Patent
Kim et al.

(10) Patent No.: US 11,834,742 B2
(45) Date of Patent: *Dec. 5, 2023

(54) METHOD OF DEPOSITION AND METHOD OF FABRICATING ELECTRONIC DEVICE USING THE SAME

(71) Applicants: SK hynix Inc., Icheon (KR); Industry-University Cooperation Foundation Hanyang University ERICA Campus, Ansan (KR)

(72) Inventors: Woo-Hee Kim, Siheung (KR); Jinseon Lee, Jeonju (KR); Jeong-Min Lee, Ansan (KR); Daehyun Kim, Icheon (KR); Changhan Kim, Icheon (KR)

(73) Assignees: SK hynix Inc., Icheon (KR); Industry-University Cooperation Foundation Hanyang University ERICA Campus, Ansan (KR)

( * ) Notice: Subject to any disclaimer, the term of this patent is extended or adjusted under 35 U.S.C. 154(b) by 42 days.

This patent is subject to a terminal disclaimer.

(21) Appl. No.: 17/588,134

(22) Filed: Jan. 28, 2022

(65) Prior Publication Data
US 2022/0243330 A1    Aug. 4, 2022

(30) Foreign Application Priority Data
Jan. 29, 2021    (KR) ........................ 10-2021-0013344

(51) Int. Cl.
| | |
|---|---|
| *C23C 16/00* | (2006.01) |
| *C23C 16/455* | (2006.01) |
| *C23C 16/30* | (2006.01) |
| *C23C 16/40* | (2006.01) |

(52) U.S. Cl.
CPC ...... *C23C 16/45553* (2013.01); *C23C 16/303* (2013.01); *C23C 16/402* (2013.01); *C23C 16/45536* (2013.01)

(58) Field of Classification Search
CPC ............ C23C 16/45553; C23C 16/303; C23C 16/402; C23C 16/45536
See application file for complete search history.

(56) References Cited

U.S. PATENT DOCUMENTS

| | | | | |
|---|---|---|---|---|
| 2021/0118684 A1* | 4/2021 | Todd | ................. | H01L 21/02312 |
| 2022/0235461 A1* | 7/2022 | Kim | ................. | H01L 21/02219 |

FOREIGN PATENT DOCUMENTS

| | | |
|---|---|---|
| KR | 20160061983 A | 6/2016 |
| KR | 20190120425 A | 10/2019 |

* cited by examiner

*Primary Examiner* — Hai Y Zhang

(57) ABSTRACT

A deposition method may include: providing a structure to be deposited that includes a silicon oxide area and a silicon nitride area having different surface characteristics from each other; and performing an atomic layer deposition (ALD) process in a reactor provided with the structure to selectively form a silicon oxide layer on the silicon oxide portion between the silicon oxide portion and the silicon nitride portion. The ALD process may include: supplying a silicon precursor into the reactor to selectively adsorb the silicon precursor to a surface of the silicon oxide portion; purging the reactor; supplying an inhibitor material into the reactor to selectively adsorb the inhibitor material to a surface of the silicon nitride portion; purging the reactor; supplying an oxygen-containing source into the reactor; and purging the reactor.

26 Claims, 21 Drawing Sheets

Initial surface state

Surface treatment

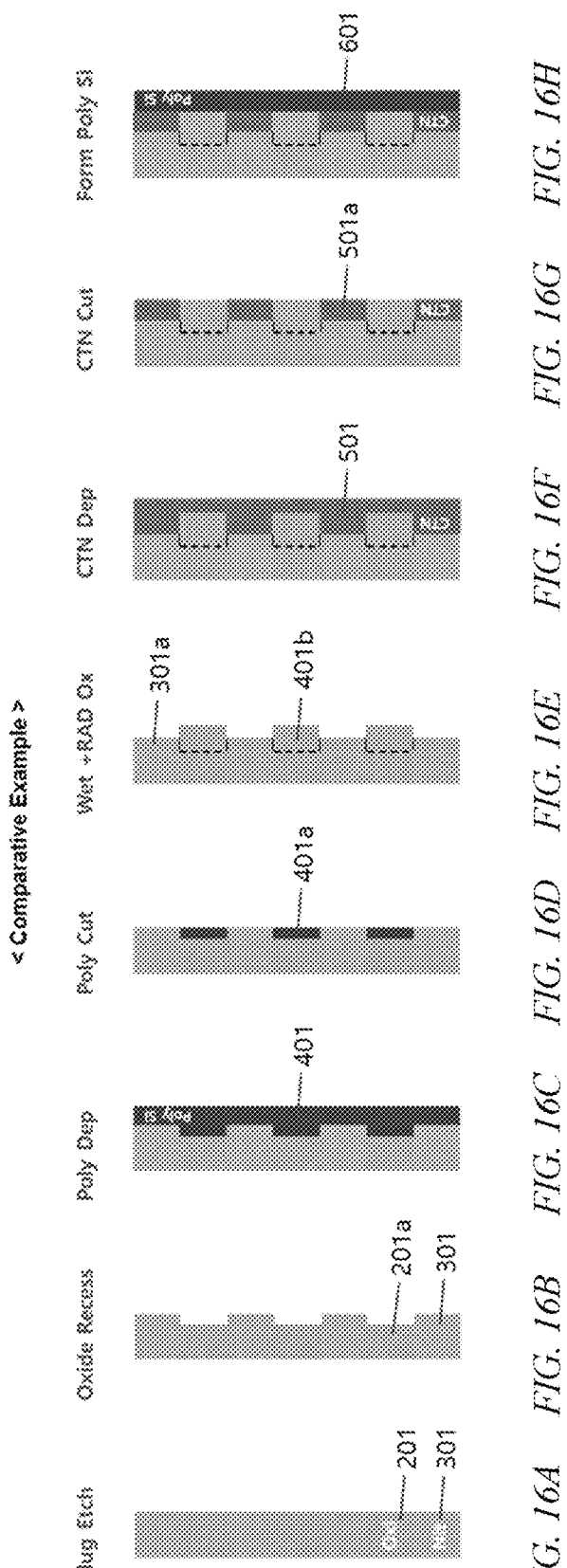

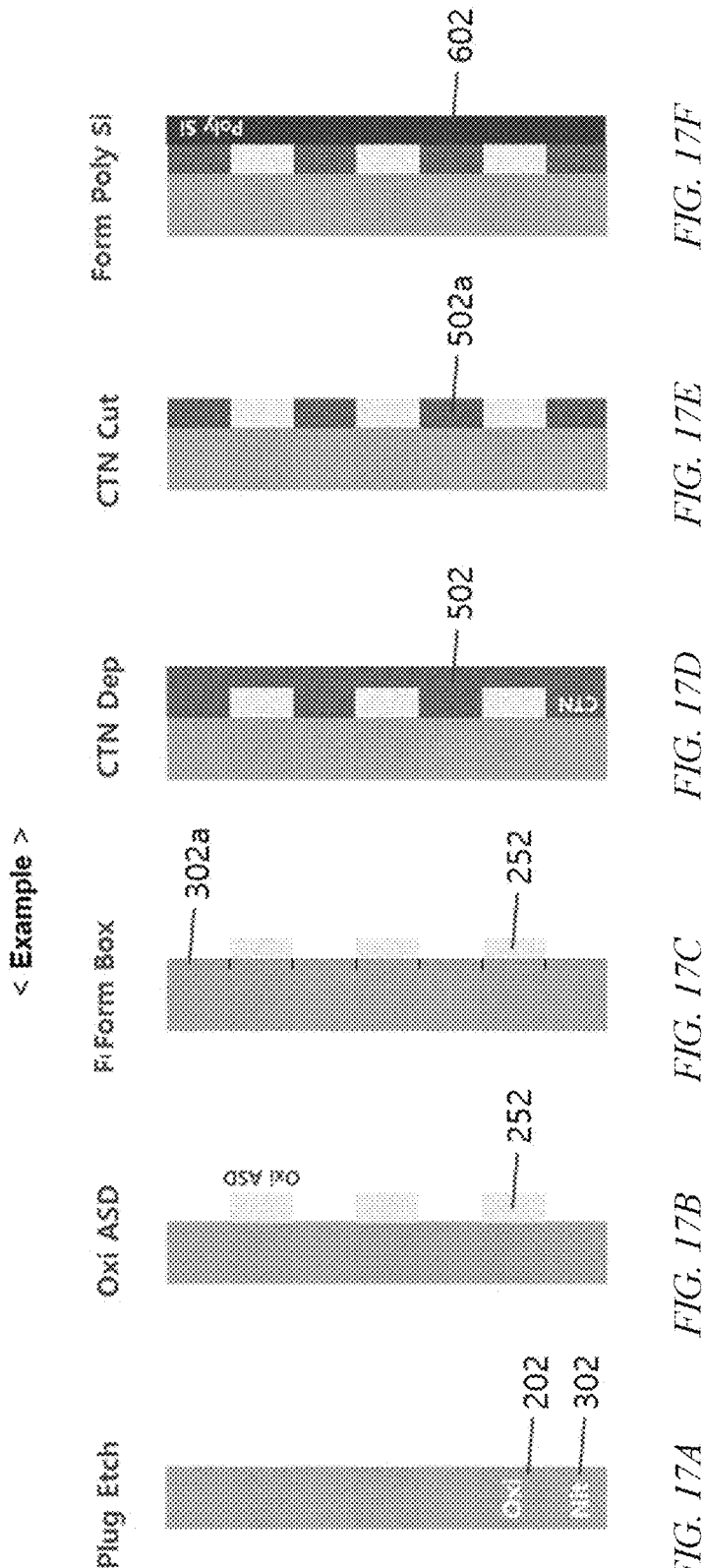

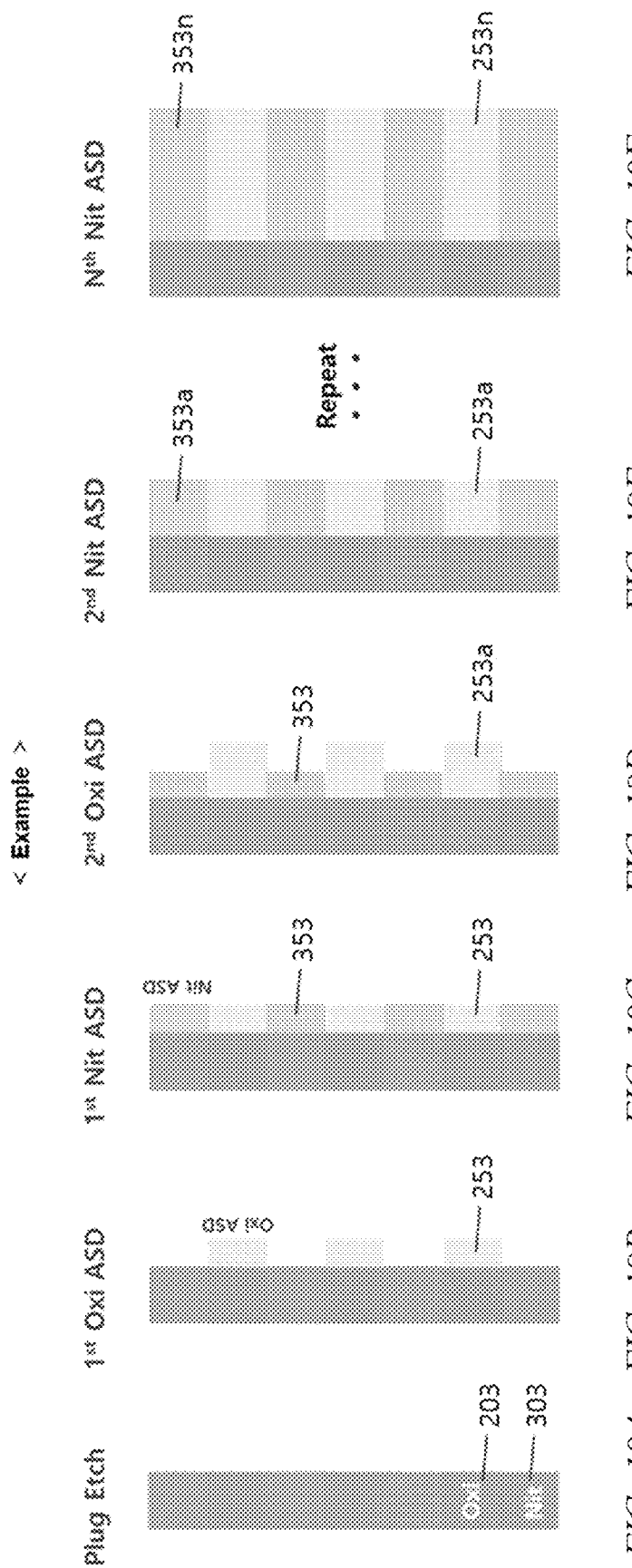

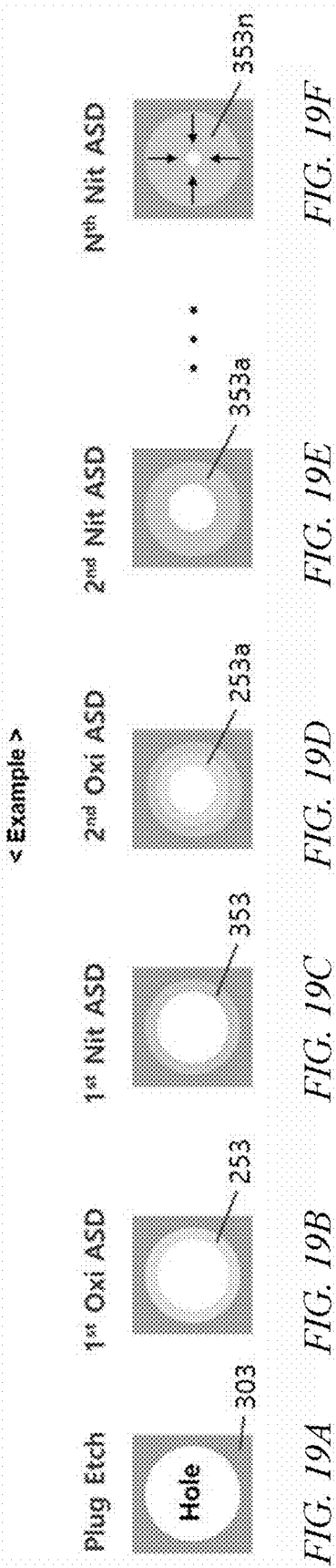

METHOD OF DEPOSITION AND METHOD OF FABRICATING ELECTRONIC DEVICE USING THE SAME

CROSS-REFERENCE TO RELATED APPLICATION

The present application claims under 35 U.S.C. § 119(a) to Korean application number 10-2021-0013344, filed on Jan. 29, 2021, which is herein incorporated by reference in its entirety.

BACKGROUND

1. Field

The present disclosure relates to a deposition method and a method of fabricating a device using the same, and more particularly, to a method of deposition and method of fabricating electronic device using the same.

2. Description of the Related Art

As the degree of integration and aspect ratio of various electronic devices (e.g., semiconductor devices) increase, various limitations and problems may arise in conventional top-down lithography and etching processes performed from top to bottom of the structure. For example, with higher integration of memory devices, the aspect ratio and stacking number of three-dimensional vertical NAND (V-NAND) devices are increased, and the tier size is decreasing in the vertical direction. Thus, when cells having an information storage film, particularly a charge trapping layer, are formed by a conventional top-down lithography/etching process, inter-cells non-uniformity and thus interference problems or operation error may occur.

Accordingly, there is a need for technology development and related research to overcome the limitations of the conventional top-down device fabrication and to extend the degree of freedom of atomic scale patterning methods in a three-dimensional structures. Technology development of an ultra-precision patterning method applicable inside the three-dimensional NAND device can overcome scaling limitations for next-generation NAND flash device development and can further increase the stacking number.

SUMMARY

The technical problem to be solved by the present disclosure is to overcome the limitations of conventional top-down deposition and device fabrication, and to provide a deposition method (e.g., an area-selective deposition method) capable of extending the degree of freedom of the deposition and patterning methods for various substrate structures including three-dimensional structures. In particular, the technical problem to be solved by the present disclosure is to provide an area-selective deposition method which is advantageous for the implementation of a high-aspect-ratio/high-integration shape in connection with the manufacture of an element or a device having a three-dimensional shape, and which can expand the degree of freedom of the integration process.

Another technical problem to be solved by the present disclosure is to provide an area-selective deposition method capable of increasing the selectivity of thin-film deposition by using, for example, an aminosilane-based inhibitor material.

Another technical problem to be solved by the present disclosure is to provide an area-selective deposition method capable of easily forming a thin film selectively on a first material surface or a second material surface, the first material surface and the second material surface being different from each other.

Another technical problem to be solved by the present disclosure is to provide a method for manufacturing an electronic device to which the area-selective deposition method described above is applied.

The problems to be solved by the present disclosure are not limited to the above-mentioned problems, and other problems not mentioned may be understood by those skilled in the art from the following description.

According to an example of the present disclosure, there is provided an area-selective deposition method including: providing a structure to be deposited, which includes a silicon oxide area and a silicon nitride area that have different surface characteristics; and performing an atomic layer deposition (ALD) process in a reactor provided with the structure to be deposited to selectively form a silicon oxide layer on the silicon oxide area among the silicon oxide area and the silicon nitride area, wherein the ALD process includes: a first supply step of supplying a silicon precursor into the reactor to selectively adsorb the silicon precursor to a surface of the silicon oxide area; a first purge step of purging the reactor; a second supply step of supplying an inhibitor material into the reactor to selectively adsorb the inhibitor material to a surface of the silicon nitride area; a second purge step of purging the reactor; a third supply step of supplying an oxygen-containing source into the reactor; and a third purge step of purging the reactor.

The providing of the structure to be deposited may include performing a surface treatment on the silicon oxide area and the silicon nitride area to form a first functional group on the surface of the silicon oxide area and to form a second functional group different from the first functional group on the surface of the silicon nitride area. The first functional group may include an —OH functional group, and the second functional group may include an —NH$_2$ functional group.

The surface treatment may be performed with a solution containing hydrogen fluoride (HF). In another embodiment, the surface treatment may be performed by a dry process containing fluorine (F), and in some embodiments, the dry process may be carried out by plasma treatment with at least one of N$_2$, NH$_3$, N$_2$H$_4$, H$_2$, or a mixed gas of two or more thereof, together with or instead of the fluorine. The silicon precursor may be an aminosilane-based silicon precursor.

The aminosilane-based silicon precursor may include diisopropylaminosilane (DIPAS). The silicon precursor may be selectively adsorbed to a surface of the silicon oxide area among the silicon oxide area and the silicon nitride area to form SiH$_3$ on the surface of the silicon oxide area.

The inhibitor material may be an aminosilane based inhibitor material. The aminosilane-based inhibitor material may include N,N-diethylamino trimethylsilane (DEATMS).

The inhibitor material may be selectively adsorbed to the surface of the silicon nitride area among the silicon oxide area and the silicon nitride area to form Si(CH$_3$)$_3$ on the surface of the silicon nitride area. The oxygen-containing source may include ozone (O$_3$).

The process temperature of the ALD process may be about 150° C. or lower.

The forming of the silicon oxide layer may include: sequentially performing the first supply step, the first purge step, the second supply step, the second purge step, the third supply step, and the third purge step in a first cycle of the ALD process; and repeating the first supply step, the first purge step, the third supply step, and the third purge step one or more times in sequence after the first cycle.

The structure to be deposited may include a laminate in which a silicon oxide thin film and a silicon nitride thin film are alternately and repeatedly laminated on an upper surface of a substrate, the laminate may be provided with at least one opening formed in a lamination direction of the silicon oxide thin film and the silicon nitride thin film, and the silicone oxide layer may be selectively formed from a side of the silicone oxide thin film exposed to an inner surface of the opening.

The structure to be deposited may include at least one silicon oxide area and at least one silicon nitride area arranged on an upper surface of a substrate in a direction parallel to the substrate.

The area-selective deposition method may further include removing the inhibitor material adsorbed on the surface of the silicon nitride area.

According to another example of the present disclosure, there is provided a method of manufacturing an electronic device, including: providing a structure to be deposited including a silicon oxide area and a silicon nitride area having different surface characteristics; and forming a material film on the structure to be deposited by using the area-selective deposition method described above. The electronic device may include, for example, a three-dimensional V-NAND device.

According to another example of the present disclosure, there is provided an area-selective deposition method including: providing a structure to be deposited including a silicon oxide area and a silicon nitride area having different surface characteristics; and performing an atomic layer deposition (ALD) process in a reactor equipped with the structure to be deposited to selectively form silicon oxide layer on the silicon nitride area among the silicon oxide area and silicon nitride area, wherein the ALD process includes: a first supply step of supplying an aminosilane-based precursor material into the reactor to adsorb the precursor material on both a surface of the silicon oxide area and a surface of the silicon nitride area; a first purge step of purging the reactor; a second supply step for supplying an oxygen-containing source into the reactor to cause a selective silicon oxide formation reaction on the silicon nitride area among the silicon oxide area and the silicon nitride area.

The providing of the structure to be deposited may include performing a surface treatment on the silicon oxide area and the silicon nitride area to form a first functional group on the surface of the silicon oxide area and to form a second functional group different from the first functional groups on the surface of the silicon nitride area.

The first functional group may include an —OH functional group, and the second functional group may include an —$NH_2$ functional group. The aminosilane-based precursor material may include N,N-diethylamino trimethylsilane (DEATMS).

The aminosilane-based precursor material may be adsorbed on the surface of the silicon oxide area to form O—Si—$(CH_3)_3$, and may be adsorbed on the surface of the silicon nitride area to form N—Si—$(CH_3)_3$. The process temperature of the ALD process may be about 150° C. or lower.

The forming of the silicon oxide layer may include sequentially performing the first supply step, the first purge step, the second supply step, and the second purge step in a first cycle of the ALD process, and, after the first cycle, may further include: a third supply step of supplying an aminosilane-based second precursor material into the reactor; a third purge step of purging the reactor; a fourth supply step of supplying a second oxygen-containing source into the reactor; and a fourth purge step of purging the reactor, wherein the third supply step, the third purge step, the fourth supply step, and the fourth purge step may be repeated one or more times in sequence. The second precursor material may include diisopropylaminosilane (DIPAS).

According to another example of the present disclosure, there is provided a method of manufacturing an electronic device, including: providing a structure to be deposited including a silicon oxide area and a silicon nitride area having different surface characteristics; and forming a material film on the structure to be deposited by using the area-selective deposition method described above.

The electronic device may include, for example, a three-dimensional V-NAND device.

According to embodiments of the present disclosure, it is possible to implement an area-selective deposition method which can overcome limitations and problems of conventional top-down type deposition and device fabrication, and which can expand the degree of freedom of the deposition and patterning methods with regard to various substrate structures including three-dimensional structures. In particular, when the area-selective deposition method according to the example of the present disclosure is applied, in connection with the manufacture of a three-dimensional V-NAND device, it is possible to easily obtain the manufacturing of a high-aspect-ratio/high-integration device, and to expand the degree of freedom of the device integration process.

Further, according to embodiments of the present disclosure, for example, an aminosilane-based inhibitor material can be used to implement an area-selective deposition method that can increase the selectivity of thin film deposition.

Furthermore, according to embodiments of the present disclosure, it is possible to implement an area-selective deposition method capable of easily forming a thin film selectively on a first material surface or a second material surface among a first material surface which is, for example, the surface of a silicon oxide area and a second material surface which is different therefrom, and which is, for example, the surfaced of a silicon nitride area.

The area-selective deposition method according to embodiments of the present disclosure is usefully applicable to the fabrication of a variety of very small electronic/mechanical devices, including three-dimensional V-NAND devices and MEMS.

BRIEF DESCRIPTION OF THE DRAWINGS

FIGS. 11A, 111B, and 11C are perspective views showing a case where a deposition method (e.g., an area-selective deposition method) according to an embodiment of the present disclosure is applied to a three-dimensional stack;

FIGS. 16A, 16B, 16C, 16D, 16E, 16F, 16G, and 16H illustrate an integration process according to a comparative example, and the comparative example may be a part of a V-NAND device fabrication process according to a conventional process;

FIGS. 17A, 17B, 17C, 17D, 17E, and 17F illustrate an integration process employing a deposition method (e.g., an area-selective deposition process) according to an embodiment of the present disclosure;

FIGS. 18A, 18B, 18C, 18D, 18E, and 18F illustrate an element forming process to which an area-selective deposition step is applied, according to another embodiment of the present disclosure; and FIGS. 19A, 19B, 19C, 19D, 19E, and 19F are plan views (i.e., top-views) of respective process steps shown in FIGS. 18A to 18F.

DETAILED DESCRIPTION OF THE INVENTION

Hereinafter, embodiments (or examples) of the present disclosure will be described in detail with reference to the accompanying drawings.

Embodiments of the present disclosure which will be described below are provided to more clearly illustrate the present disclosure to those skilled in the art, the scope of the present disclosure is not limited by the following embodiments, and the following embodiments can be modified in various different forms.

The terminology used herein is for the purpose of describing particular embodiments only and is not intended to limit the present disclosure. As used herein, the singular forms may include the plural forms as well, unless the context clearly indicates otherwise. In addition, the terms "comprises" and/or "comprising," when used in the present specification, specify the presence of described shapes, steps, numerals, operations, members, elements, and/or groups thereof, and do not preclude the presence or addition of one or more other shapes, steps, numerals, operations, members, elements, and/or groups of thereof. Furthermore, the term "connection" used herein is not only intended to imply that certain members are directly connected, but also to imply that certain members are indirectly connected through another member further interposed therebetween.

Furthermore, when a member is referred to herein as being "on" another member, this includes not only the case where the member is in contact with the other member, but there is another member between the two members. The term "and/or" used herein includes any one and all combinations of one or more of listed items. In addition, the terms "about," "substantially," and the like, used herein, are used in the sense of their numerical or degree of category or close proximity, in view of their inherent manufacturing and material tolerances, and the exact or absolute numerical values provided to aid in understanding the present application are used to prevent infringers from unfairly using the described disclosure.

Hereinafter, embodiments of the present disclosure will be described in detail with reference to the accompanying drawings. The size or thickness of the areas or parts shown in the accompanying drawings may be somewhat exaggerated for clarity and ease of description. Like numerals refer to like elements throughout the detailed description.

Figure 1A:
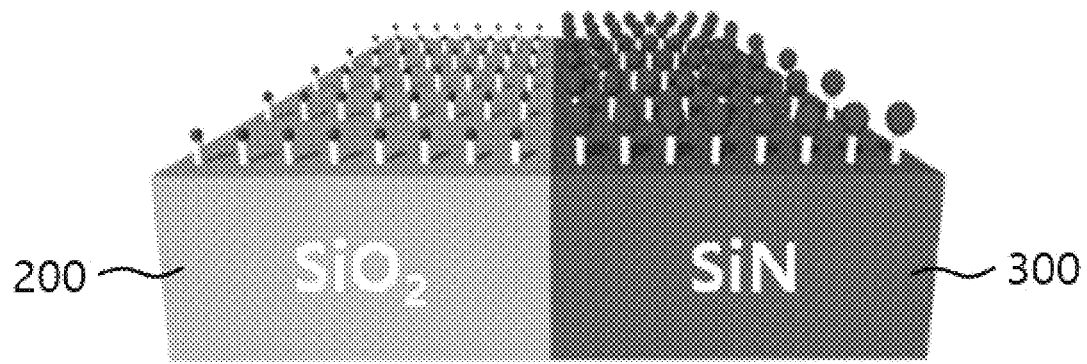
FIGS. 1A and 1B are perspective views explaining providing a structure to be deposited in a deposition method (e.g., an area-selective deposition method) according to an embodiment of the present disclosure.
Figure 1B:
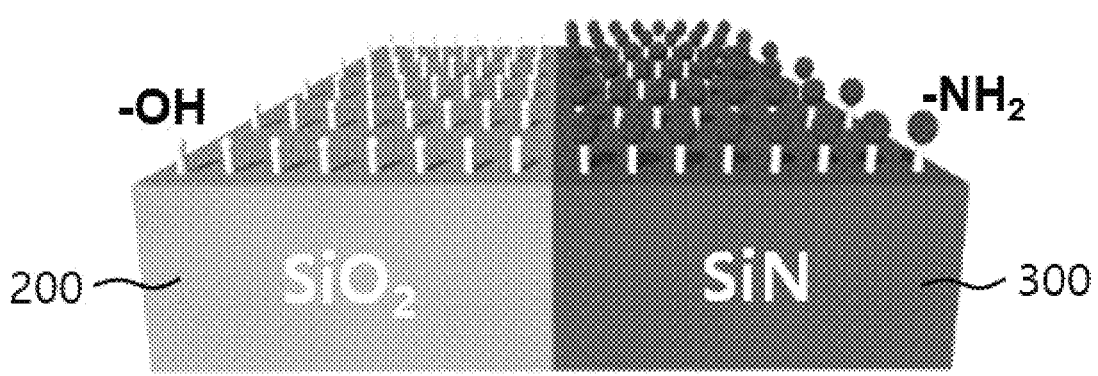

FIGS. 1A and 1B are perspective views for explaining a step of providing a structure to be deposited, which may be applied to a deposition method (e.g., an area-selective deposition method) according to an example (or an embodiment) of the present disclosure.

Referring to FIG. 1A, a structure to be deposited, which may include a silicon oxide portion (e.g., a silicon oxide area) 200 and a silicon nitride portion (e.g., a silicon nitride area) 300, may be provided on a substrate (not shown). The substrate may be a silicon substrate, other semiconductor substrate, or a different type of substrate, for example, an insulated substrate or conductive substrate other than a semiconductor. The type of the substrate is not limited and may be variously altered. The silicon oxide area 200 may be an $SiO_x$ area, and the silicon nitride area 300 may be an $Si_xN_y$ area. The $SiO_x$ is not only a stoichiometric silicon oxide with X=2, but may also be oxygen deficient or oxygen rich silicon oxide, and embodiments of the present disclosure are not limited thereto. Similarly, the $Si_xN_y$ is not only a stoichiometric silicon nitride such as $Si_3N_4$, but may also be nitrogen deficient or nitrogen rich silicon nitride. The silicon oxide area 200 and the silicon nitride area 300 may be characterized in that the areas have the same or different surface heights and are adjacent to each other or spatially separate from each other, depending on the shape or design of a micro or ultra-micro structure such as a semiconductor device or a microelectromechanical system (MEMS), but embodiments of the present disclosure are not limited thereto. In addition, the surfaces of the silicon oxide area 200 and the silicon nitride area 300 are not limited to substantially flat surfaces, and may be curved surfaces or may be surfaces which have other geometric profiles or are patterned with a given shape. These surfaces may have an orientation angle, for example, 0° parallel to the ground, 90° perpendicular to the ground, or any other oblique angles, and these angles may be equal to or different from each other. Specifically, an upper surface of each of the silicon oxide area 200 and the silicon nitride area 300 may be parallel to the horizontal direction with respect to the orientation of FIG. 1A, and thus have an orientation angle of 0°.

Referring to FIG. 1B, a surface treatment may be performed on the silicon oxide area 200 and the silicon nitride area 300 of the structure to be deposited to form a first functional group on the surface (e.g., an upper surface) of the silicon oxide area 200 and a second functional group on the surface (e.g., an upper surface) of the silicone nitride area 300. The surface treatment can be performed, for example, with a solution containing hydrogen fluoride (HF). In other examples, the surface treatment may be performed by a dry process using a gas containing fluorine (F), and in some examples, the dry process may be carried out by plasma treatment using at least one of $N_2$, $NH_3$, $N_2H_4$, $H_2$, or a mixed gas of two or more thereof, together with or replacing the fluorine. Alternatively, the surface treatment may be performed in a thermal treatment manner in a vacuum or gas (e.g., an inert gas such as $N_2$, $NH_3$, $N_2H_4$, $H_2$, or the like) atmosphere.

The first functional group formed on the surface of the silicon oxide area 200 by the surface treatment may be or include —OH, and the second functional group formed on the surface of the silicon nitride area 300 may be or include —$NH_2$. As a result of the surface treatment, as shown in FIG. 1B, a structure to be deposited including the silicon oxide area 200 and the silicon nitride area 300 having different surface characteristics can be provided. The different surface characteristics between the silicon oxide area 200 and the silicon nitride area 300 may be due to the different surface functional groups. However, forming the structure to be deposited including the silicon oxide area 200 and the silicon nitride area 300 having the different surface characteristics described above is not limited to the above-described example, and may be modified according to embodiments.

Figure 2A:
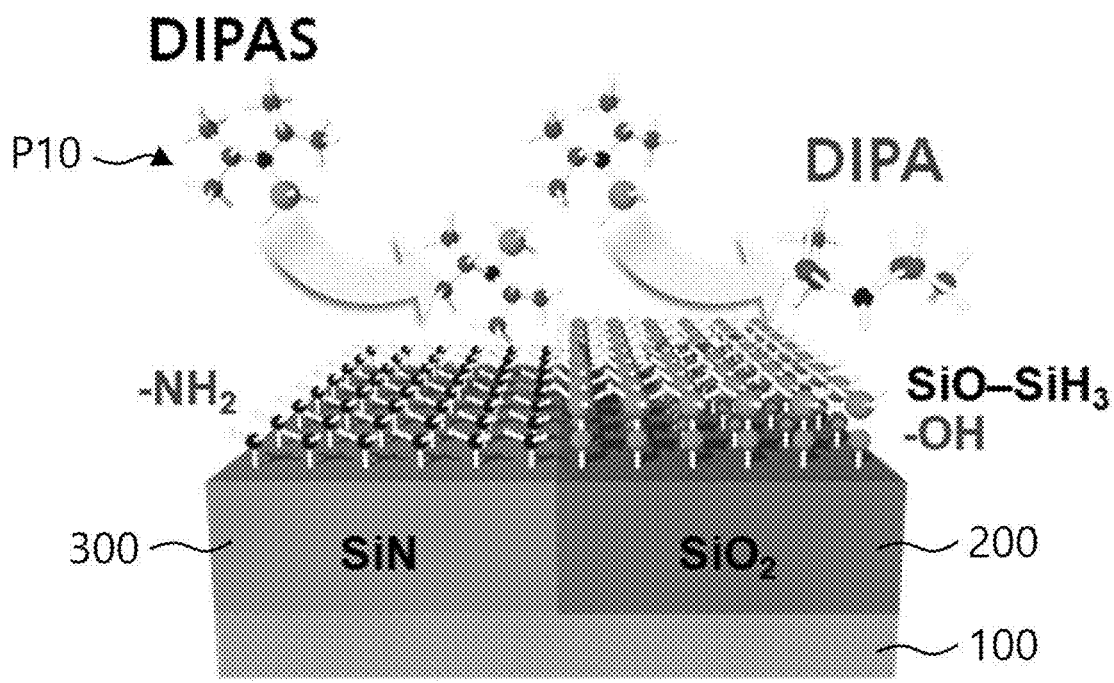
FIGS. 2A, 2B, and 2C are perspective views illustrating a deposition method (e.g., an area-selective deposition method) according to an embodiment of the present disclosure.
Figure 2B:
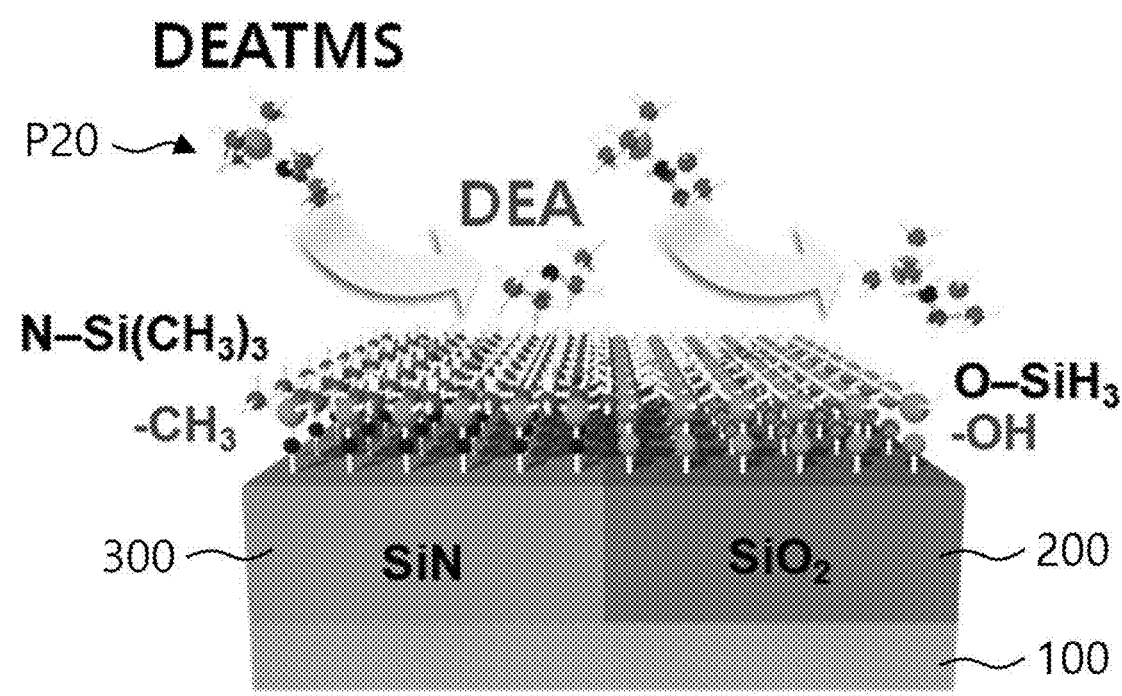
Figure 2C:
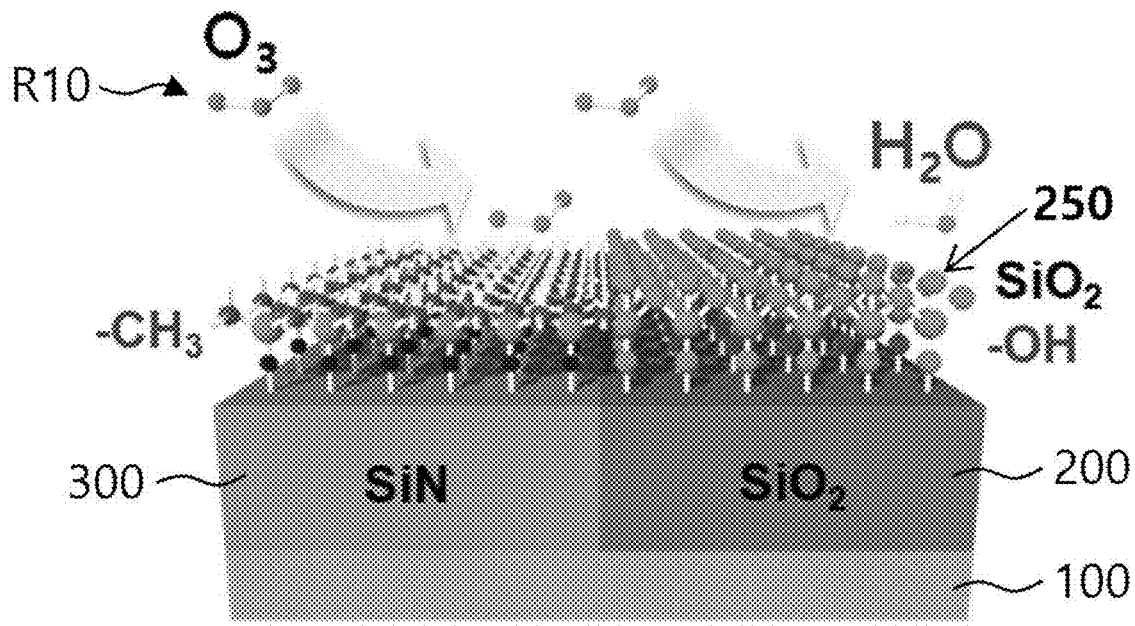

FIGS. 2A, 2B, and 2C are perspective views illustrating a deposition method (e.g., an area-selective deposition method) according to an example of the present disclosure.

Referring to FIG. 2A, a structure to be deposited including a silicon oxide portion (e.g., a silicon oxide area) 200 and a silicon nitride portion (e.g., a silicon nitride) area 300 having different surface characteristics may be provided using the method described in FIGS. 1A and 1B.

The silicon oxide area 200 and the silicon nitride area 300 may be provided on a substrate 100, and, in other examples, the silicon oxide area 200 and the silicon nitride area 300 may be independently separate areas provided on different substrates or structures, respectively. The surfaces of the silicon oxide area 200 and the silicon nitride area 300 may have a first functional group (e.g., an —OH functional group) and a second functional group (e.g., an —$NH_2$ functional group), respectively, by the surface treatment. In the illustrated example, the at least one silicon oxide area 200 and the at least one silicon nitride area 300 may be arranged on the upper surface of the substrate 100 in a direction parallel to the substrate 100. For example, in the example of FIG. 2A, the silicon oxide area 200 and the silicon nitride area 300 may be disposed on the upper surface of the substrate and arranged in the horizontal direction with respect to the orientation of FIG. 2A, which is parallel to the upper surface of the substrate 100.

An atomic layer deposition (hereinafter, referred to as "ALD") process using an aminosilane-based silicon precursor P10 may be performed on the silicon oxide area 200 and the silicon nitride area 300 in a reactor in which the structure to be deposited is placed. The ALD process may include a first supply step of supplying the aminosilane-based silicon precursor P10 into the reactor to selectively adsorb the silicon precursor P10 onto the surface of the silicon oxide area 200, a first purge step of purging the reactor, a second supply step of supplying an inhibitor material into the reactor to selectively adsorb the inhibitor material onto the surface of the silicon nitride area 300, a second purge step of purging the reactor, a third supply step of supplying an oxygen-containing source, e.g., an oxidant, into the reactor, and a third purge step of purging the reactor. FIG. 2A shows a first supply step of the supplying an aminosilane-based silicon precursor P10 into the reactor.

Figure 3:
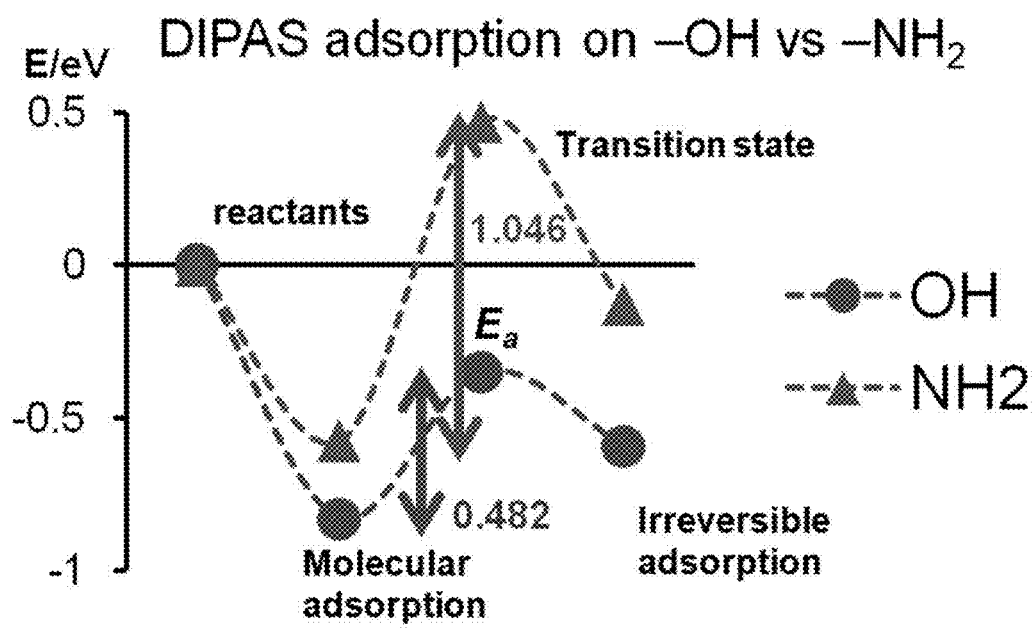
FIG. 3 is a graph showing activation energy for DIPAS adsorption on —$NH_2$ and —OH.

The silicon precursor P10 may be an aminosilane-based precursor. The aminosilane may form a hydrophobic surface. As a specific example, the aminosilane-based silicon precursor P10 may be diisopropylaminosilane (DIPAS). Since, in the DIPAS, activation energy for reacting with the —$NH_2$ functional group is at least twice as large as activation energy to react with an —OH functional group, the DIPAS is selectively adsorbed to the —OH functional group between the —$NH_2$ functional group and the —OH functional group, and adsorption to the —$NH_2$ functional group is limited. FIG. 3 is a graph showing the activation energy of DIPAS adsorption on —$NH_2$ and —OH. Referring to FIG. 3, it can be seen that the activation energy for reacting DIPAS with the —$NH_2$ functional group (1.046 E/ev) is at least two times greater than the activation energy for reacting DIPAS with the —OH functional group (0.482 E/ev). Thus, referring back to FIG. 2A, DIPAS may be selectively adsorbed to the —OH functional group of the silicon oxide area 200. DIPAS may be adsorbed to the surface of the silicon oxide area 200 and react with —OH to form —$SiH_3$, and the reaction by-product, i.e., diisopropylamine (DIPA) may be substantially removed out in a gas phase form. This reaction may be carried out relatively stably at a low temperature of about 150° C. or less. Therefore, in order to maximize the selectivity of adsorption due to the above-described difference in activation energy, an ALD process which is a layer-by-layer assembly method as a low-temperature deposition method is advantageous. Although not shown, after the first supply step, the first purge step of purging the reactor may be performed.

Referring to FIG. 2B, after the first purge step, the second supply step of supplying an inhibitor material P20 into the reactor to selectively adsorb the inhibitor material P20 to the surface of the silicon nitride area 300 may be performed. The inhibitor material P20 may be a precursor material for an inhibitor. The inhibitor material P20 may be an aminosilane-based material and may be a material that is different from an aminosilane-based silicon precursor P10. The inhibitor material P20 may be, for example, N,N-diethylamino trimethylsilane (DEATMS). When —$SiH_3$ is formed on the surface of the silicon oxide area 200 after the DIPAS treatment, DEATMS supplied thereafter is selectively adsorbed only to the silicon nitride area 300 without being adsorbed to —SiH₃, and then DEATMS may react with —NH₂ functional group in the silicon nitride area 300 to form Si(CH₃)₃.

DEATMS may then be removed out in a reaction by-product, i.e., diethylamine (DEA), in a gaseous phase form. This reaction by DEATMS may take place, for example, in a temperature range of about 100° C. to 300° C. The inhibitor material P20, such as DEATMS, can be selectively adsorbed to and react with the silicon nitride area 300 to act as an inhibitor that serves as a chemical barrier to a deposition process (film formation reaction) on the surface of the silicon nitride area 300 in a subsequent ALD process. Thus, the selectivity of the area-selective deposition process according to the examples of the present disclosure may be increased through pairing of a precursor for growth and a precursor for an inhibitor, which can promote growth in one area and inhibit growth in the other area, respectively, resulting in selectively growing a predetermined area. Although not shown, after the second supply step, a second purge step of purging the reactor may be performed.

Referring to FIG. 2C, the third supply step of supplying an oxygen containing source (i.e., oxidant) R10 into the reactor may be performed. The oxygen-containing source R10 supplied in the third supply step may include, for example, any one of oxygen (O2) and ozone (O₃) or a mixed gas thereof, and may preferably be ozone (O₃). The oxygen-containing source R10 can selectively react with —SiH₃ of the silicon oxide area 200 to form a silicon oxide layer 250, and a reaction by-product, i.e., H₂O, may be substantially removed out of the reactor in the form of a gas phase in the third purge step. This reaction may be carried out relatively stably at a low temperature of about 150° C. or less. At this time, since Si(CH₃)₃ may be formed on the surface of the silicon nitride area 300, the deposition of a film, e.g., deposition of an SiO₂ film by ALD, in the silicon nitride area 300 may be further suppressed, for example, due to the steric hindrance of the Si(CH₃)₃. Thus, by applying an inhibitor material (e.g., the inhibitor material P20 in FIG. 2B), the selectivity of the area-selective deposition process according to the embodiment may be drastically enhanced. Although not shown, after the third supply step, the third purge step of purging the reactor may be performed.

The ALD process, i.e., silicon precursor supply/first purge/inhibitor material supply/second purge/oxygen-containing source supply/third purge in the area-selective deposition method according to the embodiments described with reference to FIGS. 2A to 2C may preferably be performed at a process temperature of about 150° C. or less. At these temperature conditions, adsorption and reactions for area-selective deposition according to the embodiment may be made stably. However, the second supply step of supplying the inhibitor material P20 may be carried out in a temperature range of about 100° C. to 300° C.

The second supply step and the second purge step may be performed only once in the initial step (e.g., in a first cycle) of the ALD process, and may not be performed from a second cycle. Specifically, in a first cycle of the ALD process, the first supply step, the first purge step, the second supply step, the second purge step, the third supply step, and the third purge step may be performed in sequence. After the first cycle, the first supply step, the first purge step, the third supply step, and the third purge step may be repeated one or more times in sequence. For example, the first supply step, the first purge step, the third supply step, and the third purge step may be performed in sequence in each of one or more cycles after the first cycle.

After the first cycle, the process of sequentially repeating the first supply step, the first purge step, the third supply step, and the third purge step may be referred to as "repeated deposition step." The area-selective deposition method according to an example of the present disclosure may further include an "etching step" of performing an etching process on the silicon oxide area and the silicon nitride area after the repeated deposition step. Even if an inhibitor material is present on the silicon nitride area 300, as the cycle of the repeated deposition process increases, a silicon oxide layer having a predetermined thickness may also be formed on the silicon nitride area 300, and in the above-mentioned "etching step", the silicon oxide layer formed on the silicon nitride area 300 may be removed and the surface of the silicon nitride area may be reset to be fresh.

The area-selective deposition method may include a "supercycle process" that alternately repeats the repeated deposition step and the etching step. Here, if the surface of the silicon nitride area is reset by the "etching step", the second supply step and the second purge step may be performed to form an inhibitor material again on the surface in the silicon oxide area at an initial step of the ALD process after etching. The second supply step and the second purge step may be performed once in the first cycle and then optionally implemented as needed in a subsequent repeated deposition process or in the supercycle process.

Figure 4:
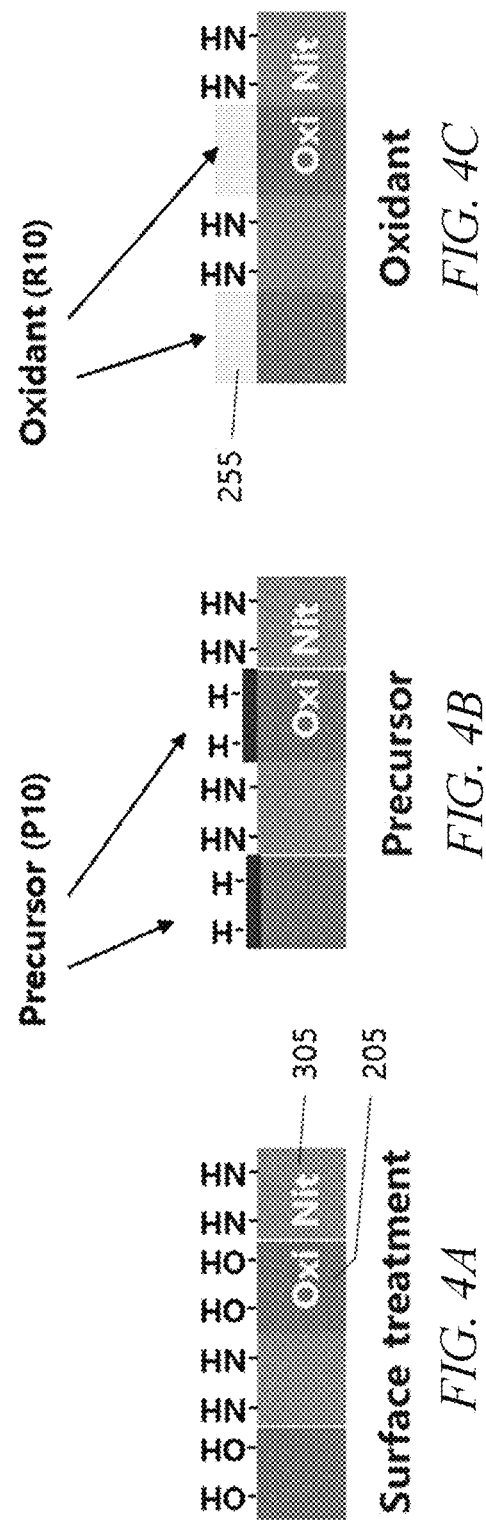
FIGS. 4A, 4B, and 4C illustrate an area-selective deposition method according to a comparative example.
Figure 5:
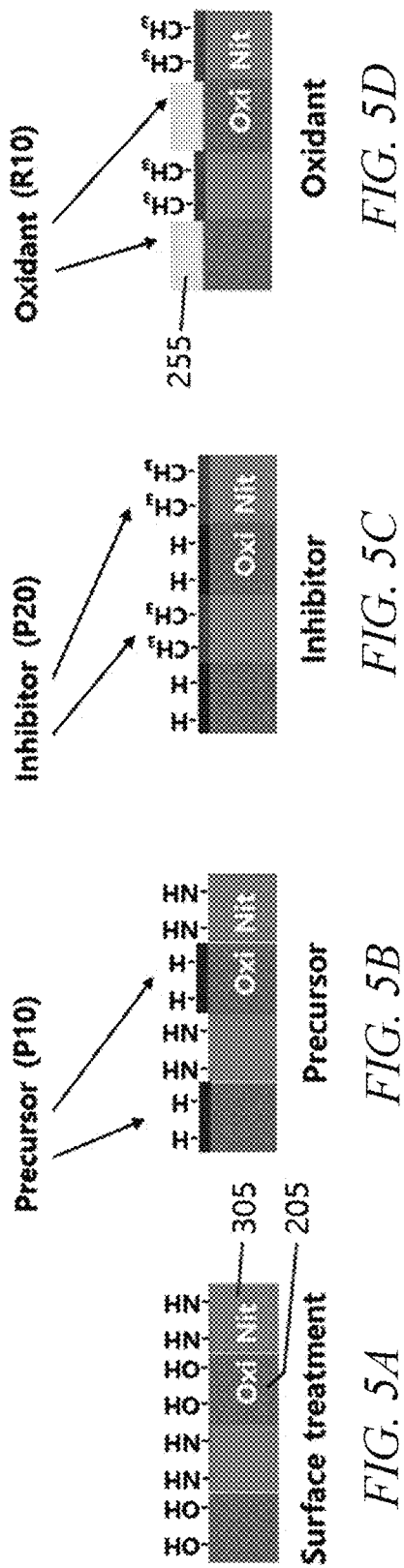
FIGS. 5A, 5B, 5C, and 5D illustrate a deposition method (e.g., an area-selective deposition method) according to an embodiment of the present disclosure.

FIGS. 4A, 4B, and 4C illustrate an area-selective deposition method according to a comparative example. The comparative example is an area-selective deposition method that does not use an inhibitor, which may be called as "inhibitor-free area-selective deposition method."

Referring to FIGS. 4A, 4B, and 4C, the area-selective deposition method according to the above comparative example may be said to be a deposition method in which the step illustrated in FIG. 2B is omitted in the process of FIGS. 2A to 2C. In step of FIG. 4A, a structure to be deposited, which includes a silicon oxide area 205 and a silicon nitride area 305 having different surface characteristics, may be provided. At this time, optionally, the surfaces of the silicon oxide area 205 and the silicon nitride area 305 may have an —OH functional group and an —NH₂ functional group, respectively, by surface treatment. The functional group formed on the surface of the silicon nitride area 305 is represented by —NH in FIG. 4A, which indicates a —NH-based functional group, for example, an —NH₂ functional group.

In step of FIG. 4B, a silicon precursor P10, such as DIPAS, may be selectively adsorbed to the surface of the silicon oxide area 205 between the silicon nitride area 305 and the silicon oxide area 205. This may be similar to that described with reference to FIG. 2A. The silicon precursor P10, such as DIPAS, may be adsorbed to the surface of the silicon oxide area 205 and react with —OH to form —SiH₃. The material formed on the surface of the silicon oxide area 205 is expressed as —H in FIG. 4B, which may indicate Si—H₃ bonding.

In step of FIG. 4C, an oxygen-containing source (i.e., an oxidizing agent) R10 such as ozone (O₃) may be supplied to selectively form a silicon oxide layer 255 only on the silicon oxide area 205. The oxygen-containing source R10 may selectively react with —SiH₃ of the silicon oxide area 205 to form the silicon oxide layer 255.

Theoretically, using the selective adsorption of the silicon precursor P10 such as DIPAS between the silicon oxide area 205 and the silicon nitride area 305 having different surface characteristics from each other, without using inhibitor materials, it may be possible that a silicon oxide layer 255 may be selectively formed only on the silicon oxide area 205 other than the silicon nitride area 305.

In this case, however, the number of ALD cycles, i.e., the number of incubation cycles, in which area-selective deposition characteristics are maintained, may be somewhat reduced compared to a method according to an embodiment of the present disclosure. For example, when no inhibitor is used, as the number of ALD cycles accumulates, a silicon oxide layer may also be formed on the silicon nitride area 305 from a predetermined time point. In view of this, in the area-selective deposition characteristics, the method according to examples of the present disclosure in which an inhibitor is used has the advantage of increasing the number of ALD cycles, thereby forming a thicker film with a higher selectivity, than the method according to the comparative example in which no inhibitor is used.

FIGS. 5A, 5B, 5C, and 5D illustrate a deposition method (e.g., an area-selective deposition method) according to an example of the present disclosure.

Referring to FIGS. 5A to 5D, in the area-selective deposition method according to the embodiment, step of FIG. 5C, i.e., a step of supplying an inhibitor material P20 to selectively adsorb the inhibitor material P20 onto the silicon nitride area 305 may be additively implemented compared with the area-selective deposition method according to the comparative example described with reference to FIGS. 4A to 4C.

Steps shown in FIGS. 5A and 5B may be the same as or similar to steps described in FIGS. 4A and 4B, respectively. In step of FIG. 5C, the inhibitor material P20 such as DEATMS may be supplied. The inhibitor material P20 may be selectively adsorbed to the silicon nitride area 305 between the silicon oxide area 205 and the silicon nitride areas 305, and may react with an —NH$_2$ functional group to form Si(CH$_3$)$_3$. Si(CH$_3$)$_3$ may serve to inhibit film deposition by subsequent ALD processes. The inhibitor material 20 may not substantially react with Si—H bonding of the silicon oxide area 205.

In step of FIG. 5D, similarly to step of FIG. 4C, an oxygen-containing source, i.e., an oxidizing agent R10 such as ozone (O$_3$) may be supplied to selectively form a silicon oxide layer 255 only on the silicon oxide area 205. Since the reaction between the oxygen-containing source R10 and the Si—H has relatively low activation energy, the silicon oxide layer 255 may be formed even at a relatively low temperature, for example, about 150° C. or less.

When an inhibitor is used as shown in FIG. 5C, the incubation cycle during which area-selective deposition characteristics are maintained may be increased, and the selectivity of deposition may be enhanced.

As an alkylating agent having bulky hydrocarbon chains (>12), a self-assembled monolayer (SAM), which is conventionally adopted as an inhibitor, is known to form a surface-inhibition layer (~3 nm thickness). However, SAM is limited in adsorption due to steric hindrance in a three-dimensional structure having a pattern size of several tens of nm or less, and thus the use thereof as inhibitors may have a limitation. By using an aminosilane-based inhibitor material (e.g., DEATMS), which is a short chain alkylating agent, in an example of the present disclosure, an ASD process can be easily or successfully carried out even within a multi-dimensional structure having a pattern size of several tens of nm or less. Further, the aminosilane-based inhibitor material used in the example of the present disclosure may be a type of silicon precursor, which may be a precursor for ALD applicable for a low temperature deposition process, and thus the ALD process (such as the process of supplying an inhibitor in-situ) employing the same may be easy to be implemented, uniform three-dimensional patterning/deposition may be possible even in a structure with a high aspect ratio, and the selective removal process of the adsorbed inhibitor material may be relatively easy.

Figure 6:
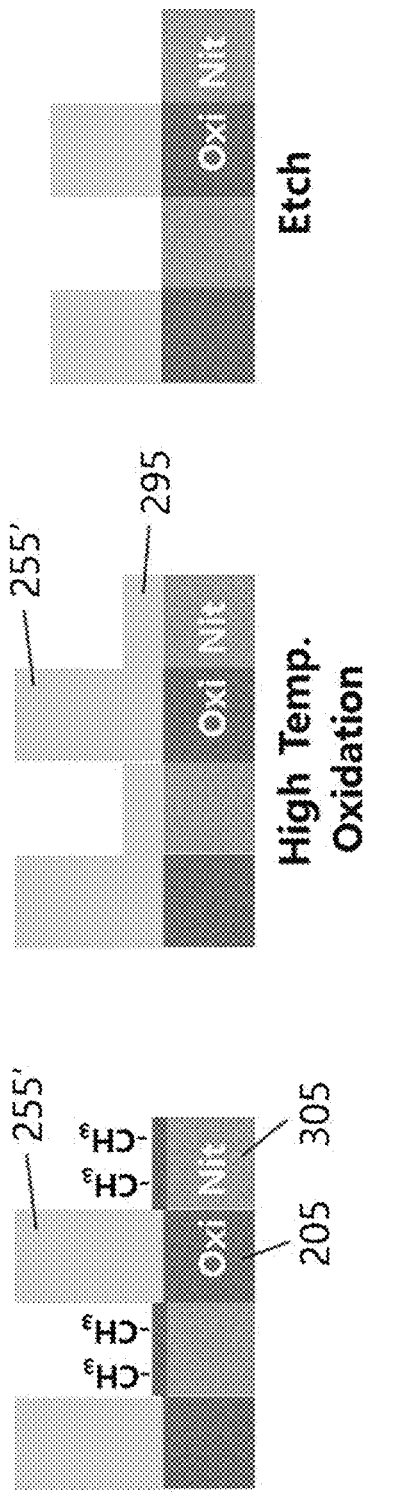
FIGS. 6A, 6B, and 6C illustrate an inhibitor removal process applicable to a deposition method (e.g., an area-selective deposition method) according to an embodiment of the present disclosure.

Since the inhibitor, e.g., Si(CH$_3$)$_3$, may be provided in the silicon nitride area 305 in step of FIG. 5D, the inhibitor may be substantially removed out through a subsequent process, if necessary. An example of a process for removing the inhibitor is shown in FIG. 6.

FIGS. 6A, 6B, and 6C illustrate an inhibitor removal process that can be applied to a deposition method (e.g., an area-selective deposition method) according to an example of the present disclosure.

Referring to FIGS. 6A to 6C, step of FIG. 6A may correspond to step of FIG. 5D, but a silicon oxide layer 255' may be thicker than that in step of FIG. 5D by a repeated deposition process.

In step of FIG. 6B, a second oxide layer 295 may be formed on the silicon nitride area 305 by oxidizing an inhibitor component provided on the silicon nitride area 305 through a thermal oxidation method. The thickness of the second oxide layer 295 may be relatively (or significantly) thin.

In step of FIG. 6C, an oxide etching process may be used to remove the second oxide layer 295. When the second oxide layer 295 is removed, the surface of the silicon nitride area 305 may be exposed. A portion of the silicon oxide layer 255' may also be etched by the oxide etching process.

Figure 7:
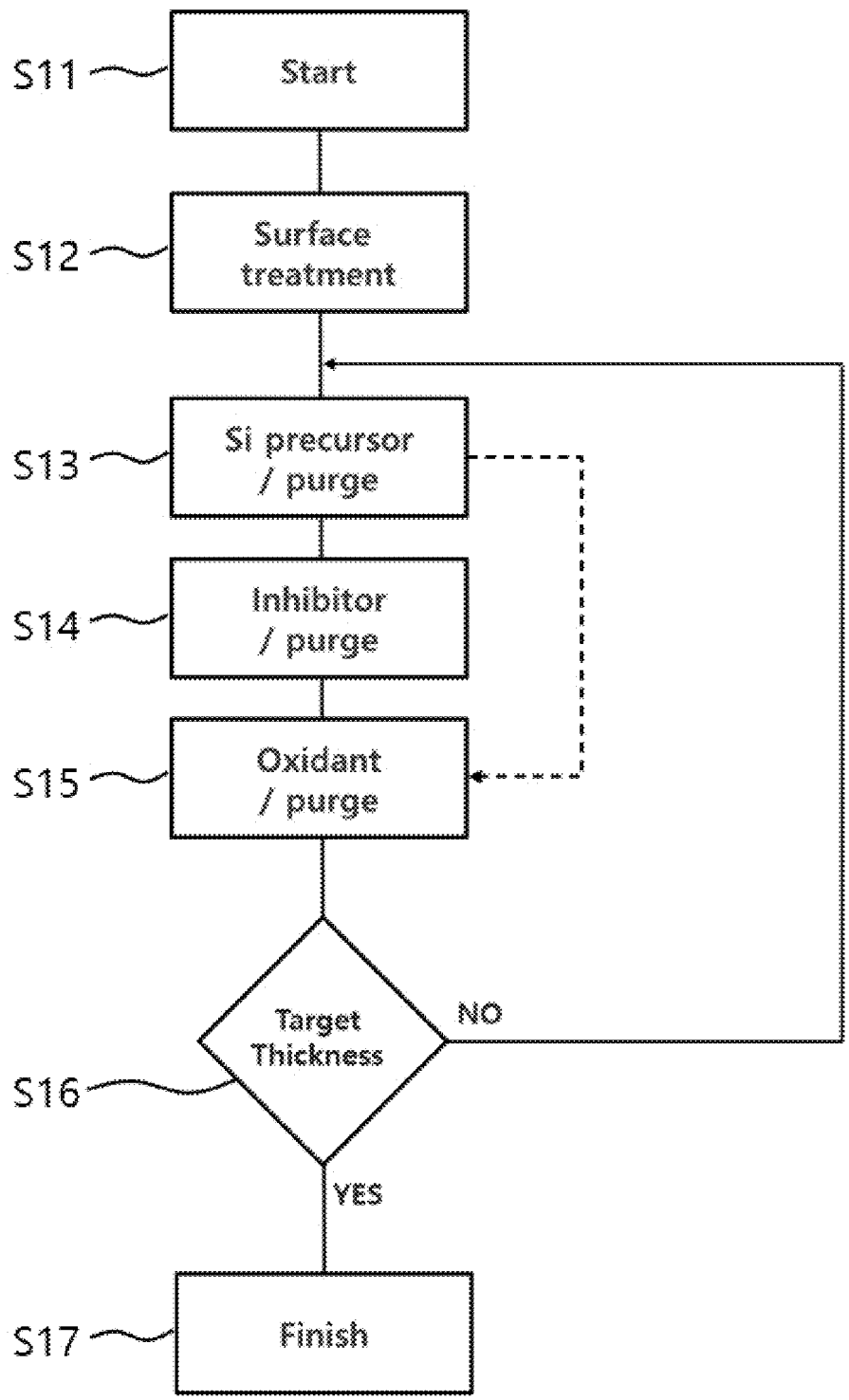
FIG. 7 is a flowchart illustrating a deposition method (e.g., an area-selective deposition method) according to an embodiment of the present disclosure.

FIG. 7 is a flowchart illustrating a deposition method (e.g., an area-selective deposition method) according to an example of the present disclosure.

Referring to FIG. 7, a first step S11 may correspond to a start step. In a second step S12, a structure to be deposited including a silicon oxide area and a silicon nitride area that have different surface characteristics from each other may be provided by using a surface treatment to the silicon oxide area and the silicon nitride area. In the second step S12, the surface treatment may be performed on the silicon oxide area and the silicon nitride area of the structure to be deposited to form a first functional group on the surface of the silicon oxide area and a second functional group on a surface of the silicon nitride area. The surface treatment may be performed, for example, with a solution containing hydrogen fluoride (HF). The first functional group formed on the surface of the silicon oxide area by the surface treatment may be —OH or may include —OH, and the second functional group may be —NH$_2$ or may include —NH$_2$. However, the surface treatment is not limited to wet chemical treatment using the hydrogen fluoride (HF) solution as described above, and may vary according to embodiments. For example, the surface treatment may be performed by plasma treatment using a gas such as N$_2$, NH$_3$, N$_2$H$_4$, or H$_2$. Alternatively, the surface treatment may be performed in a thermal treatment manner in a vacuum or gas (e.g., an inert gas such as N$_2$, NH$_3$, N$_2$H$_4$, H$_2$, or the like) atmosphere.

In a third step S13, a first supply step of supplying a silicon precursor into a reactor equipped with the structure to be deposited and a first purge step of purging the reactor may be sequentially performed. The silicon precursor may be an aminosilane-based silicon precursor. For example, the silicon precursor may include DIPAS.

In a fourth step S14, a second supply step of supplying an inhibitor material into the reactor and a second purge step of purging the reactor may be sequentially performed. Here, the inhibitor material may be an aminosilane-based inhibitor material. For example, the inhibitor material may include DEATMS.

In a fifth step S15, a third supply step of supplying an oxygen-containing source (i.e., an oxidizing agent) into the reactor and a third purge step of purging the reactor may be sequentially performed. The oxygen-containing source (i.e., an oxidizing agent) may include, for example, ozone ($O_3$).

The third to fifth steps S13 to S15 may constitute an ALD process by which a silicon oxide layer may be selectively formed on the silicon oxide area between the silicon oxide area and the silicon nitride area. The process temperature of the ALD process may be about 150° C. or lower. For example, the process temperature of the ALD process may be about 100° C. to 150° C. To be more specific, the third step S13 and the fifth step S15 may be performed at a temperature of about 150° C. or lower. The third step S13 to the fifth step S15 may preferably be performed at a temperature of about 100° C. to 150° C. as a whole (commonly). In an example, the fourth step S14 may be performed at a temperature of about 100° C. to 300° C.

After the fifth step S15, in a sixth step S16, it may be determined whether the silicon oxide layer has reached a target thickness. If it is determined in the sixth step S16 that the target thickness has not been reached, steps S13 and S15 may be performed again in sequence. At this time, step S14 may not be performed. Steps S13 and S15 may be repeated until the target thickness is reached. Step S14 may be performed in an initial ALD deposition step (i.e., a first cycle) and then Step S14 may be optionally implemented as needed in a subsequent repeated deposition or super-cycle process.

If it is determined in the sixth step S16 that the silicon oxide layer has reached the target thickness, the area-selective deposition process according to an example of the present disclosure may be finished (S17). However, the order of the area-selective deposition process described with reference to FIG. 7 is merely an example and may vary according to embodiments. The area-selective deposition process described with reference to FIG. 7 may be referred to as an "inhibitor-assisted area-selective deposition (ASD) process".

Figure 8:
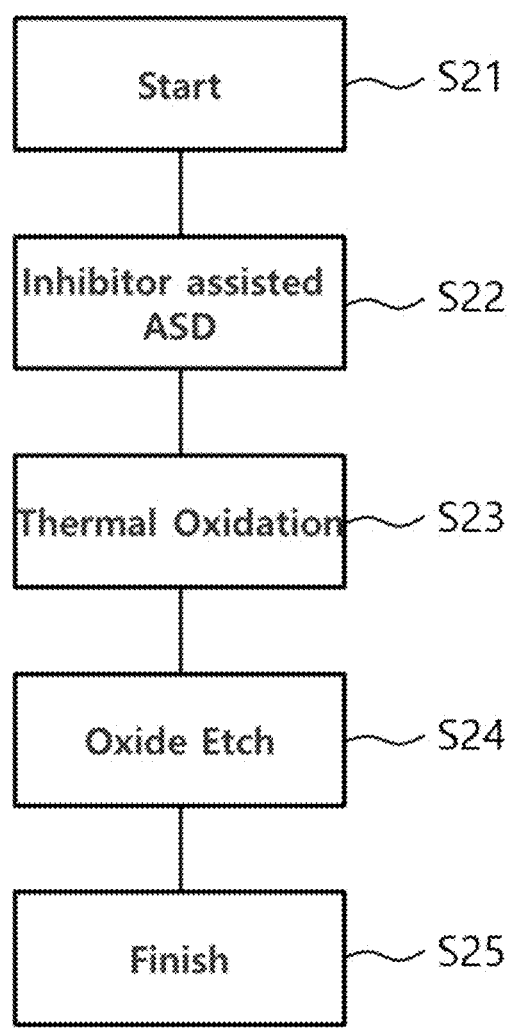
FIG. 8 is a flowchart illustrating a deposition method (e.g., an area-selective deposition method) including an inhibitor removal process according to an embodiment of the present disclosure.

FIG. 8 is a flowchart illustrating a deposition method (e.g., an area-selective deposition method) including an inhibitor removal process according to an example of the present disclosure. Here, the inhibitor removal process may be substantially the same as that described with reference to FIGS. 6A to 6C.

Referring to FIG. 8, a first step S21 may correspond to a start step. In a second step S22 an inhibitor-assisted ASD process may be performed. The second step S22 may be the same as or similar to, for example, the process illustrated in FIG. 7.

In a third step S23, an inhibitor component provided in a silicon nitride area may be oxidized by using a thermal oxidation method, thereby forming a second oxide layer oxidized from the inhibitor component on the silicon nitride area. The third step S23 may correspond to step of FIG. 6B, and the second oxide layer may correspond to the second oxide layer 295 in step of FIG. 6B.

In a fourth step S24, an oxide etching process may be used to remove the second oxide layer. The fourth step S24 may correspond to step of FIG. 6C. A fifth step S25 is a finish step.

Figure 9:
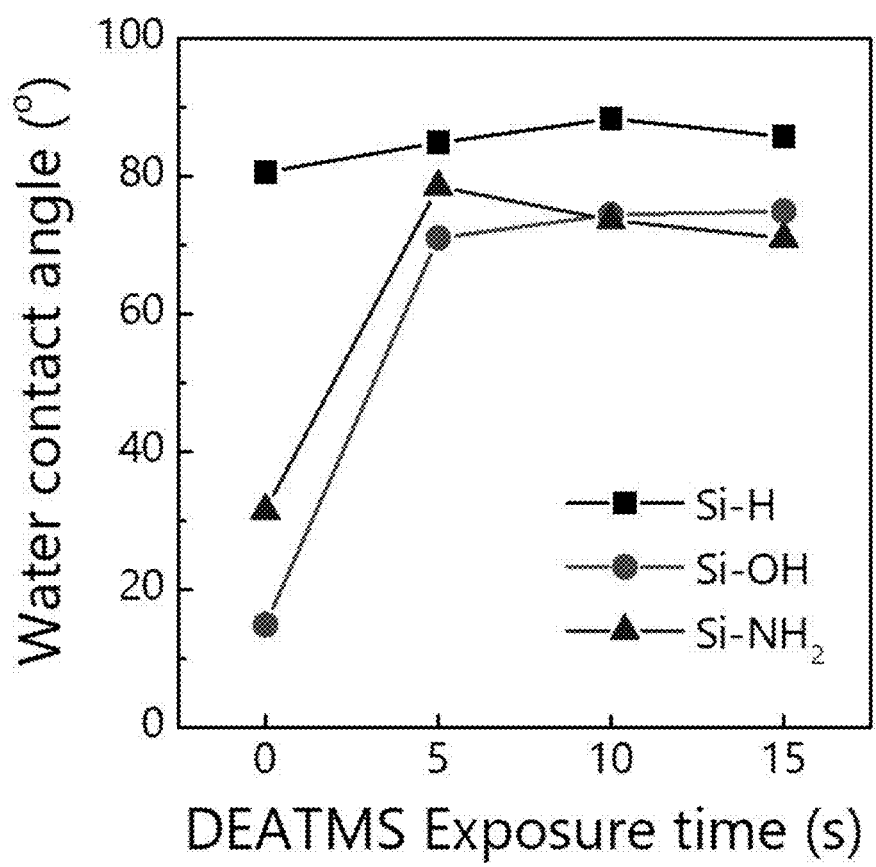
FIG. 9 is a graph showing the measurement results of changes in water contact angle depending upon an increase in the time of exposure of various surfaces to DEATMS.

FIG. 9 is a graph showing the measurement results of changes in water contact angle depending on an increase the time of exposure of various surfaces to DEATMS.

Referring to FIG. 9, even if an Si—H surface is exposed to DEATMS, the water contact angle hardly changes, which implies that DETAMS is not adsorbed to and does not react with the Si—H surface. When the time of exposure of Si—OH and Si—$NH_2$ surfaces to DEATMS is increased, the water contact angle changes greatly, which may imply that DEATMS are adsorbed well to the Si—OH surface and the Si—$NH_2$ surface. Thus, in the step of FIG. 2B, the DEATMS may be well adsorbed to the surface of the silicon nitride area 300 contrarily to the surface of the silicon oxide area 200.

Figure 10:
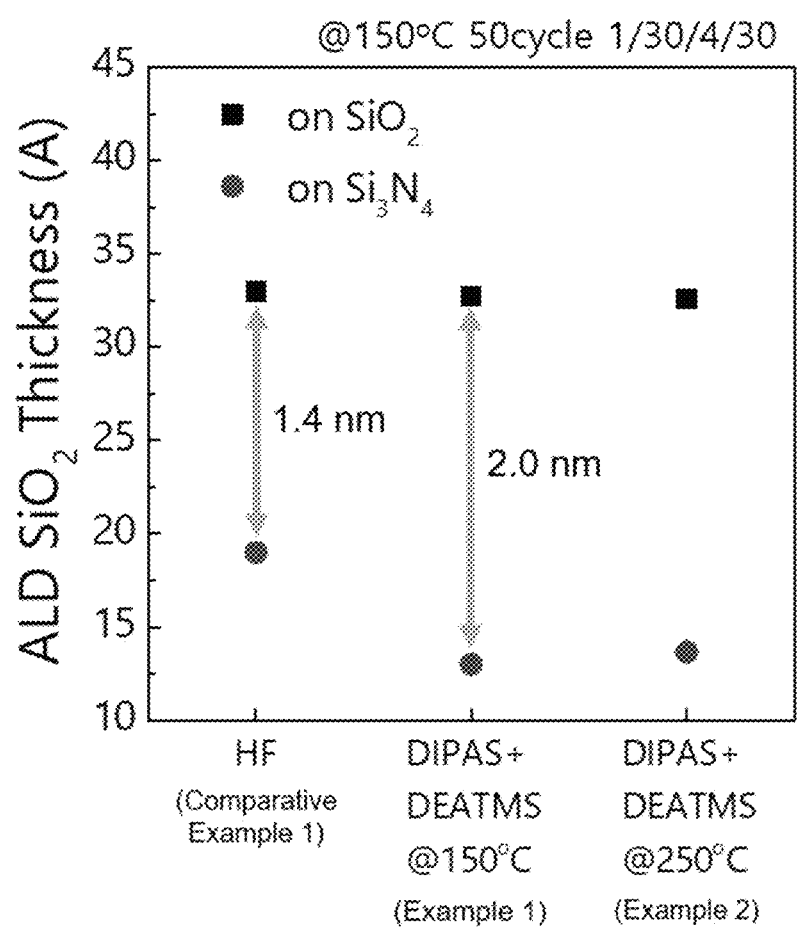
FIG. 10 is a graph showing how the selectivity of ALD $SiO_2$ thin film deposition varies in a deposition method (e.g., an area-selective deposition process) depending on inhibitor application according to an embodiment of the present disclosure.

FIG. 10 is a graph showing how the selectivity of ALD $SiO_2$ thin film deposition varies in a deposition method (e.g., an area-selective deposition process) according to an example of the present disclosure depending on inhibitor (e.g., reaction inhibitor) application. FIG. 10 includes the results of Comparative Example 1, Example 1 of the present disclosure, and Example 2 of the present disclosure. Comparative Example 1 is the case where after a surface treatment with HF, an ALD process is performed in a DIPAS/purge/$O_3$/purge cycle. Example 1 is the case where after a surface treatment with HF, a DIPAS/purge/DEATMS/purge/$O_3$/purge step is performed, and then an ALD process is performed in the DIPAS/purge/$O_3$/purge cycle. At this time, the process temperature during the supply of DEATMS was 150° C. Example 2 is the case where after surface treatment with HF, the DIPAS/purge/DEATMS/purge/$O_3$/purge step is performed, and then an ALD process is performed in the DIPAS/purge/$O_3$/purge cycle. At this time, the process temperature during the supply of DEATMS was 250° C. DEATMS has been applied as an inhibitor (e.g., reaction inhibitor).

Referring to FIG. 10, in the case of Comparative Example 1 in which DEATMS is not used, the selectivity of ALD $SiO_2$ thin film deposition on silicon oxide and silicon nitride was about 1.4 nm, and in the cases of Examples 1 and 2 in which DEATMS is used, the selectivity of ALD $SiO_2$ thin film deposition on silicon oxide and silicon nitride was about 2.0 nm. Based on these results, it can be confirmed that, when DEATMS is applied as a reaction inhibitor, ALD deposition of an $SiO_2$ thin film on silicon nitride is further suppressed and the selectivity increases.

The area-selective deposition method according to the embodiments described above may be applied to the fabrication of various electronic devices. For example, the area-selective deposition method according to the embodiment may be applicable to various electronic device including NAND, dynamic random access memory (DRAM), transistors, microelectromechanical systems (MEMS), central processing units (CPU), sensors, etc.

Figure 11A:
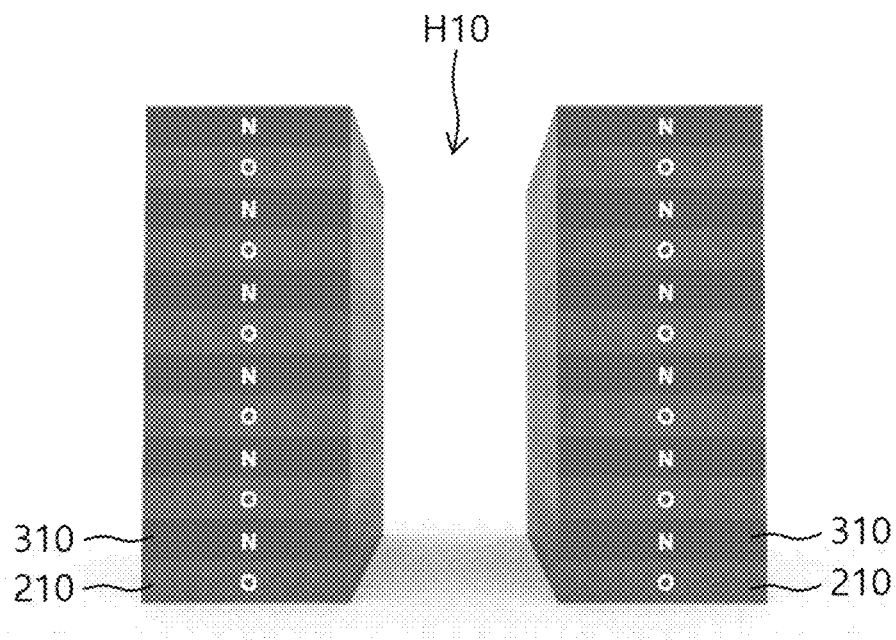
Figure 11B:
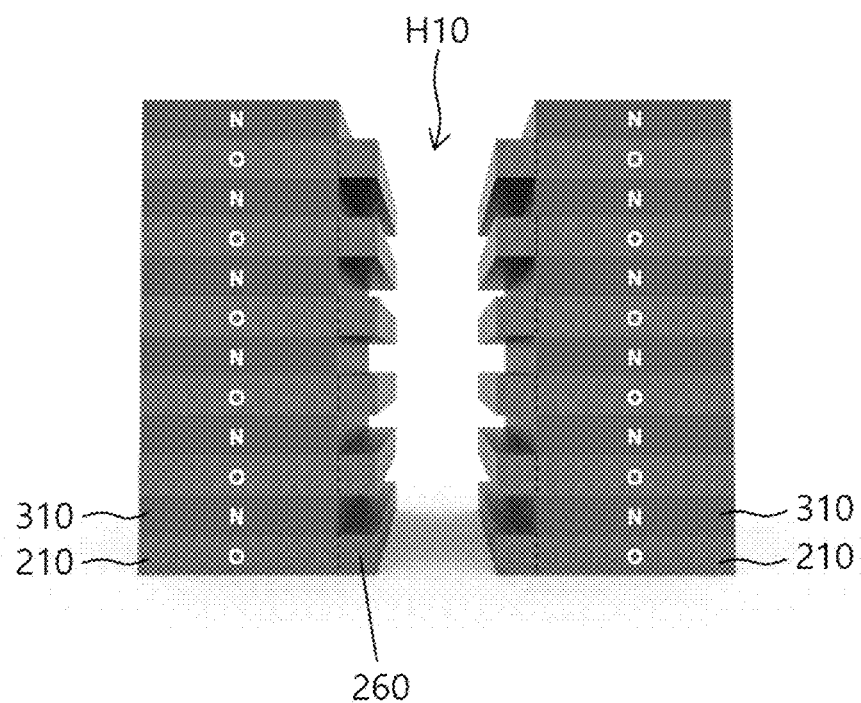
Figure 11C:
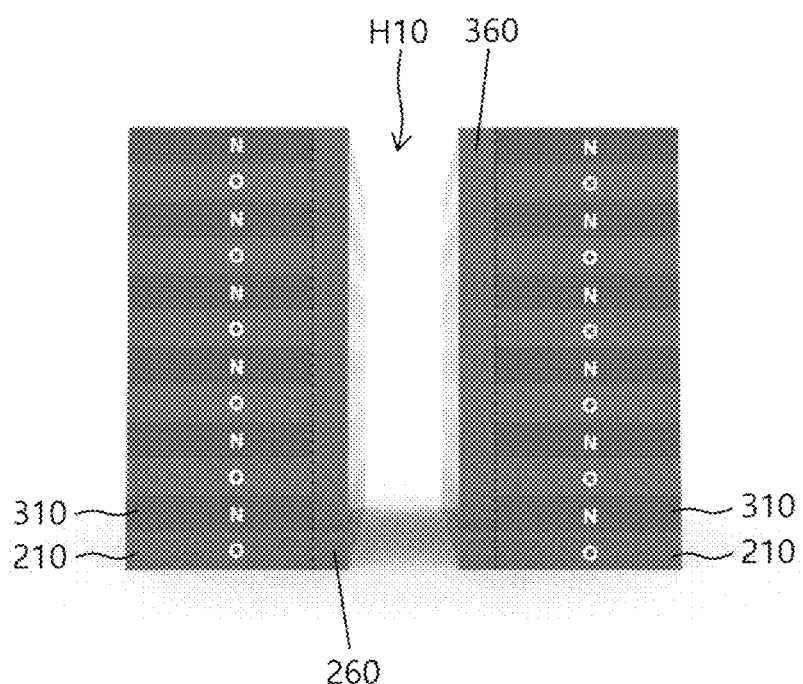

FIGS. 11A, 111B, and 11C are perspective views showing a case where a deposition method (e.g., an area-selective deposition method) according to an example of the present disclosure is applied to a three-dimensional stack.

Referring to FIG. 11A, a structure to be deposited may include a stack in which oxide films (e.g., silicon oxide thin films) 210 and nitride films (e.g., silicon nitride thin films) 310 are alternately and repeatedly stacked on the top surface of a substrate (not shown). The stack may be provided with at least one opening H10 formed in a direction in which the silicon oxide thin films 210 and the silicon nitride thin films 310 are stacked. The at least one opening H10 may be a hole or a trench type structure. Such a stack may be said to have a three-dimensionally stacked ONON stack structure. Herein, O denotes oxide and N denotes nitride. The structure of the three-dimensional stack as shown in FIG. 11A may be applied, for example, in the fabrication of three dimensional V-NAND devices.

Referring to FIG. 11B, a silicon oxide layer 260 may be selectively formed or grown on the side surface of each of the silicon oxide thin films 210, which is exposed to the opening H10, by using the above-described area-selective deposition method according to the example of the present disclosure.

Referring to FIG. 11C, after forming the silicon oxide layer 260, a silicon nitride layer 360 may be selectively formed on a side surface (i.e., the side surface exposed by the opening H10) of each of the silicon nitride thin films 310 between the silicon oxide thin films 210 and the silicon nitride thin films 310. The silicon nitride layer 360 may be formed using, for example, a conventionally known ASD process.

In the examples illustrated in FIGS. 1A to 11C, a description has been made of an area-selective deposition method for selectively forming a silicon oxide layer on the silicon oxide area between the silicon nitride area and the silicon oxide area. However, in another example of the present disclosure, a silicon oxide layer may be selectively formed on the silicon nitride area between the silicon oxide area and the silicon nitride area. This will be described in detail below with reference to FIGS. 12A to 15B.

FIGS. 12A, 12B, 12C, and 12D illustrate a deposition method (e.g., an area-selective deposition method) according to another example of the present disclosure.

Figure 12A:
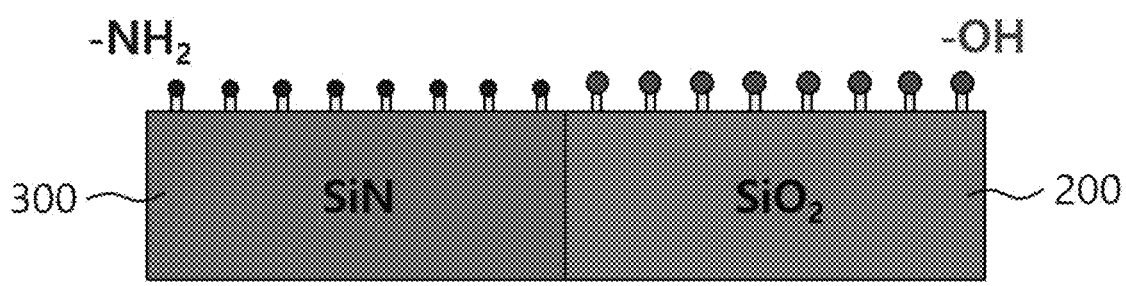
FIGS. 12A, 12B, 12C, and 12D illustrate a deposition method (e.g., an area-selective deposition method) according to another embodiment of the present disclosure.

Referring to FIG. 12A, a structure to be deposited, which includes a silicon oxide area 200 and a silicon nitride area 300 having different surface characteristics, may be provided. The surface of the silicon oxide area 200 may be provided with a first functional group, e.g., an —OH functional group, and the surface of the silicon nitride area 300 may be provided with a second functional group, e.g., an —$NH_2$ functional group. The method of providing the structure to be deposited may be the same as or similar to that described with reference to FIGS. 1A and 1B. That is, surface treatment on the silicon oxide area 200 and the silicon nitride area 300 may be performed to form the first and second functional groups.

Figure 12B:
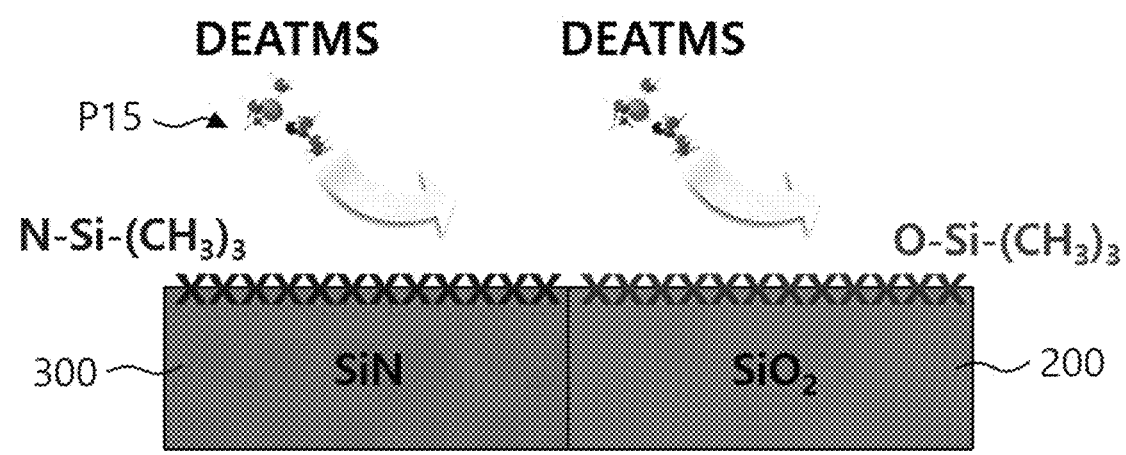

Referring to FIG. 12B, an atomic layer deposition (ALD) process using an aminosilane-based precursor material P15 may be performed on a silicon oxide area 200 and a silicon nitride area 300 in the structure to be deposited which is provided in a reactor. The ALD process may include a first supply step of supplying the aminosilane-based precursor material P15 into the reactor to adsorb the precursor material P15 onto both the surface of the silicon oxide area 200 and the surface of silicon nitride area 300, a first purge step of purging the reactor, a second supply step of supplying an oxygen-containing source into the reactor to selectively cause a silicon oxide forming reaction on the silicon nitride area 300 between the silicon-oxide areas 200 and the silicon nitride area 300, and a second purge step of purging the reactor. FIG. 12B shows the first supply step of supplying the aminosilane-based silicon precursor P15 into the reactor.

The aminosilane-based precursor material P15 may include, for example, DEATMS. The precursor material P15, such as DEATMS, may be adsorbed both onto the surface of the silicon oxide area 200 and onto the surface of the silicon nitride area 300. In addition, the precursor material P15, such as DEATMS, may be adsorbed onto the surface of the silicon oxide area 200 to form O—Si—$(CH_3)_3$, and may be adhered onto the surfaces of silicon nitride area 300 to form N—Si—$(CH_3)_3$. Here, the O—Si—$(CH_3)_3$ may be expressed as O—Si-$Me_3$, and the N—Si—$(CH_3)_3$ may be expressed as N—Si-$Me_3$. The O—Si—$(CH_3)_3$ may be the result of the reaction of DEATMS with an Si—OH surface, and the N—Si—$(CH_3)_3$ may be the result of reaction of DEATMS with an Si—$NH_2$ surface (i.e., Si—NH based surface). The O—Si—$(CH_3)_3$ may have relatively stable and robust properties, and the N—Si—$(CH_3)_3$ has relatively high reactivity properties. Although not illustrated, after the first supply step, the first purge step may be performed.

Figure 12C:
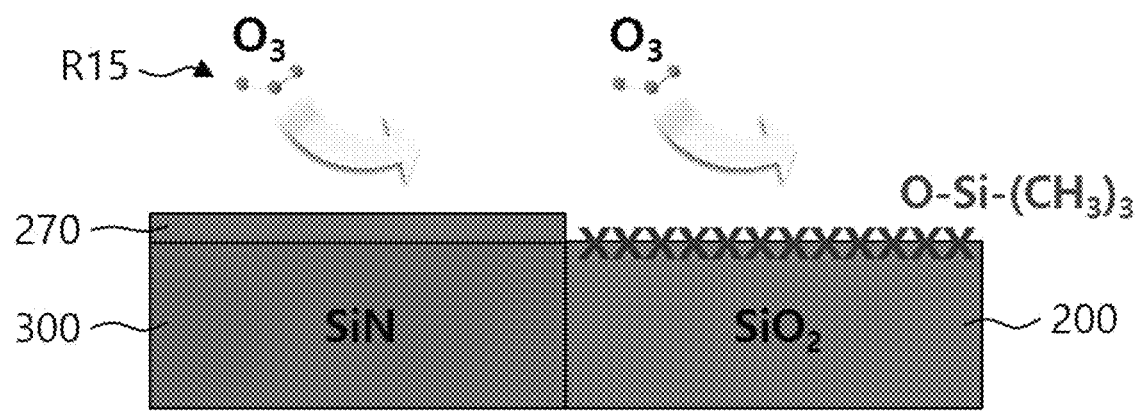

Referring to FIG. 12C, after the first purge step, the second supply step of supplying an oxygen-containing source R15 into the reactor to selectively cause a silicon oxide formation reaction on the silicon nitrides area 300 between the silicon oxide area 200 and the silicon nitride area 300 may be performed. The oxygen-containing source R15 may include, for example, ozone ($O_3$). The oxygen-containing source R15 may selectively react with N—Si—$(CH_3)_3$ between O—Si—$(CH_3)_3$ and N—Si—$(CH_3)_3$ to selectively form a silicon oxide layer 270 on the silicon nitride area 300. This reaction may be carried out relatively stably at a low temperature of about 150° C. or less. Accordingly, the process temperature of the ALD process may preferably be about 150° C. or lower. Although not shown, after the second supply step, the second purge step of purging the reactor may be performed.

In a first cycle of the ALD process, the first supply step (i.e., the step of FIG. 12B), the first purge step, the second supply step (i.e., the step of FIG. 12C), and the second purge step may be performed sequentially. The ALD process may further include, after the first cycle, a third supply step of supplying an aminosilane-based second precursor material into the reactor, a third purge step of purging the reactor, a fourth supply step of supplying a second oxygen-containing source into the reactor, and a fourth purge step of purging the reactor. The third supply step, the third purge step, the fourth supply step, and the fourth purge step may be sequentially repeated one or more times. Specifically, the third supply step, the third purge step, the fourth supply step, and the fourth purge step may be performed in sequence in each of one or more cycles after the first cycle. For example, the second precursor material may include DIPAS and the second oxygen-containing source may include ozone ($O_3$).

Figure 12D:
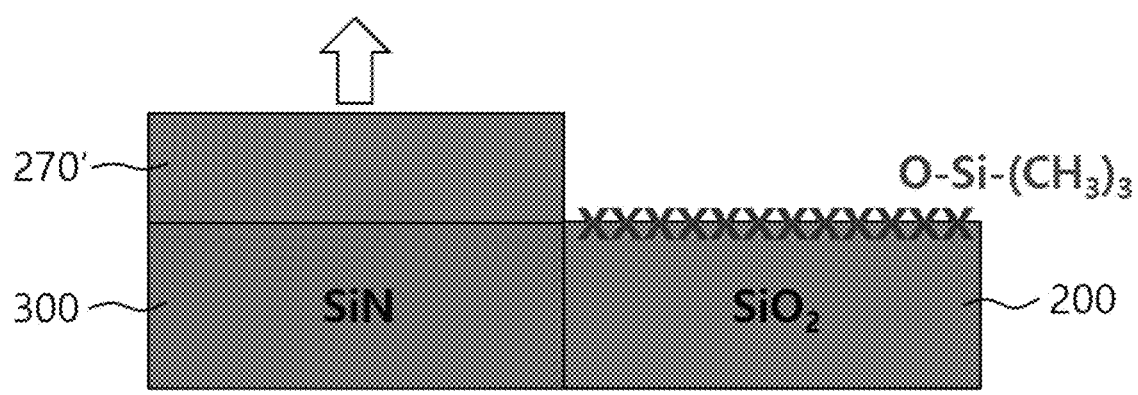

Silicon oxide can be selectively grown on the silicon oxide layer 270 in FIG. 12C by repeating the third supply step, the third purge step, the fourth supply step, and the fourth purge step one or more times in sequence. For example, after the first cycle, performing an ALD process in a DIPAS/purge/$O_3$/purge cycle may implement selective growth of silicon oxide on the silicon nitride area 300. The result of repeating the third supply step, the third purge step, the fourth supply step, and the fourth purge step one or more times in sequence may be as shown in FIG. 12D. In FIG. 12D, reference numeral 270' denotes a silicon oxide layer additionally grown on the silicon nitride area 300. The third supply step, the third purge step, the fourth supply step, and the fourth purge step may be performed, for example, at a temperature of about 150° C. or lower.

Figure 13:
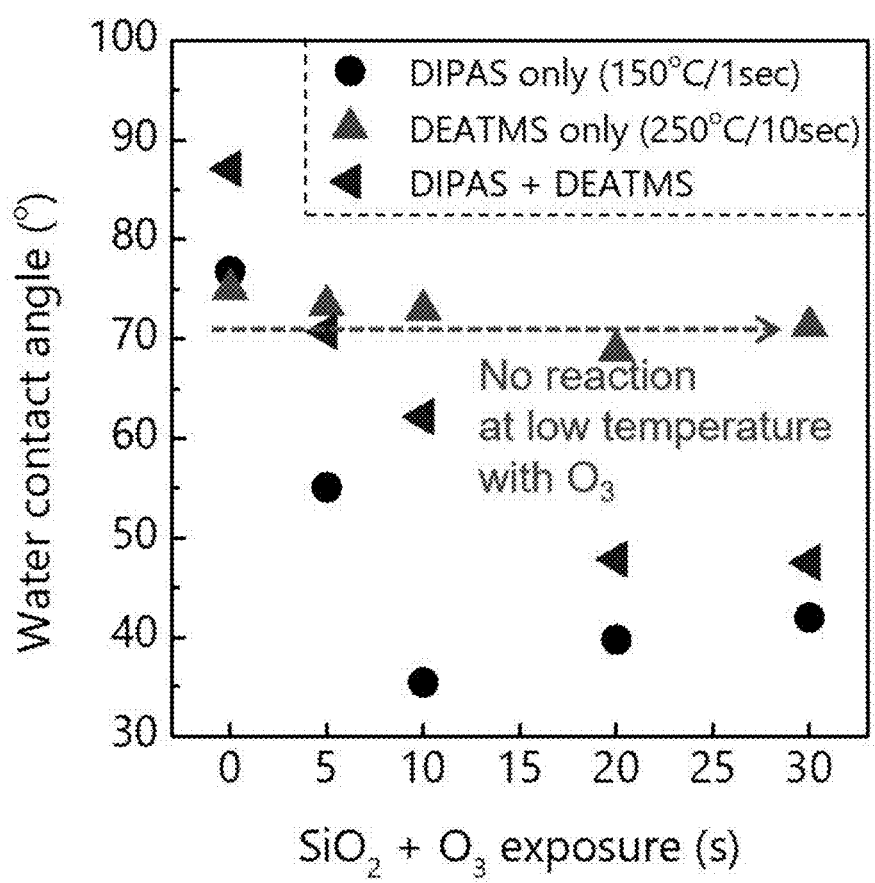
FIG. 13 is a graph showing the measurement results of changes in water contact angle when silicon oxide ($SiO_2$), which has an —OH functional group on a surface thereof, is exposed to DEATMS or the like and subsequently exposed to ozone ($O_3$)

FIG. 13 is a graph showing the measurement results of changes in water contact angle when silicon oxide ($SiO_2$), which has an —OH functional group on the surface thereof, is exposed to DEATMS or the like and subsequently exposed to ozone ($O_3$).

Referring to FIG. 13, in the case of "DEATMS only" accounting for the exposure of silicon oxide ($SiO_2$) to DEATMS, it can be confirmed that the characteristics of the water contact angle almost remain unchanged even upon exposure to DEATMS and then to ozone ($O_3$). This implies that the O—Si—$(CH_3)_3$ formed by reaction of DEATMS with Si—OH on the surface of the silicon oxide ($SiO_2$) hardly reacts with ozone ($O_3$).

Figure 14:
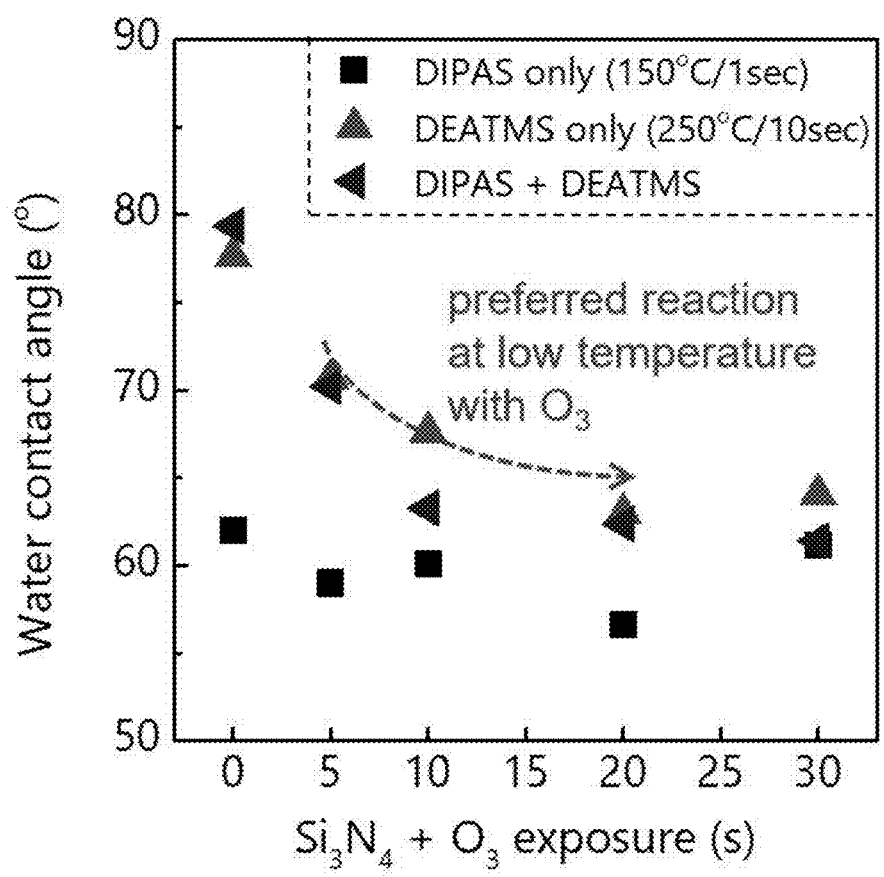
FIG. 14 is a graph showing the measurement results of changes in water contact angle when silicon nitride ($Si_3N_4$), which has an —$NH_2$ functional group on a surface thereof, is exposed to DEATMS or the like and subsequently exposed to ozone ($O_3$)

FIG. 14 is a graph showing the measurement results of changes in water contact angle when silicon nitride ($Si_3N_4$), which has an —$NH_2$ functional group on the surface thereof, is exposed to DEATMS or the like and then subsequently exposed to ozone ($O_3$).

Referring to FIG. 14, in the case of "DEATMS only" accounting for the exposure of silicon nitride ($Si_3N_4$) to DEATMS, it can be confirmed that the characteristic of the water contact angle changes greatly as the time of exposure to ozone ($O_3$) increases when exposed to DEATMS and then to ozone ($O_3$). This implies that the N—Si—$(CH_3)_3$ formed by reacting DEATMS with Si—$NH_2$ on the surface of silicon nitride ($Si_3N_4$) reacts easily with ozone ($O_3$). Thus, according to an example of the present disclosure, a silicon oxide layer may be selectively formed on silicon nitride ($Si_3N_4$).

The area-selective deposition method according to the examples described with reference to FIGS. 12A to 12D may be applied to the fabrication of various electronic devices. For example, the area-selective deposition method according to embodiments may be applicable to various electronic device fields including NAND, DRAM, transistors, MEMS, CPU, sensors, etc.

Figure 15A:
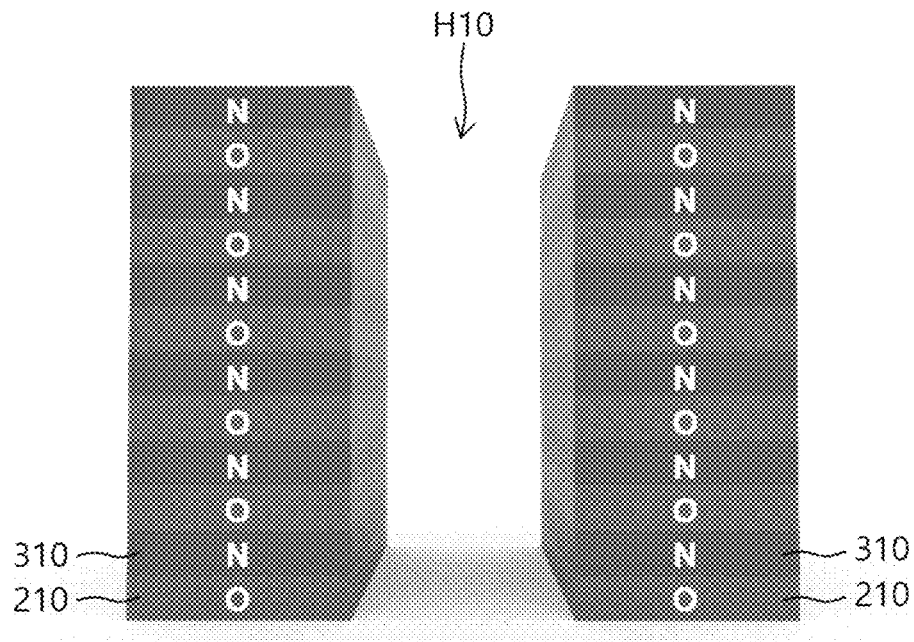
FIGS. 15A and 15B are perspective views showing a case in which a deposition method (e.g., an area-selective deposition method) according to an embodiment of the present disclosure is applied to a three-dimensional stack.
Figure 15B:
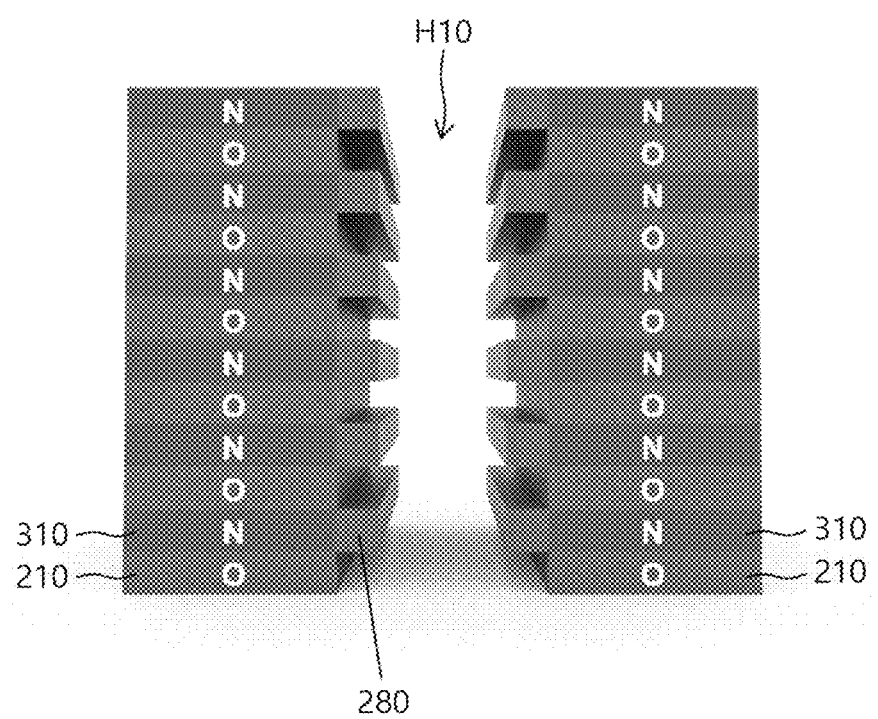

FIGS. 15A and 15B are perspective views showing a case where a deposition method (e.g., an area-selective deposition method) according to an example of the present disclosure is applied to a three-dimensional stack.

Referring to FIG. 15A, a structure to be deposited may include a stack in which silicon oxide thin films 210 and silicon nitride thin films 310 are alternately and repeatedly stacked on the top surface of a substrate (not shown). The stack may be provided with at least one opening H10 formed in a direction in which the silicon oxide thin films 210 and the silicon nitride thin films 310 are stacked. The at least one opening H10 may have a shape of a hole or a trench. Such a stack may be said to have a three-dimensionally stacked ONON stack structure. Herein, O denotes oxide and N denotes nitride. The structure of the three-dimensional stack as illustrated in FIG. 15A may be applied, for example, in the manufacture of a three-dimensional V-NAND device.

Referring to FIG. 15B, a silicon oxide layer 280 may be selectively formed on the side surface of each of the silicon nitride thin films 310, exposed to the opening H10, by using the area-selective deposition method according to the example of the present disclosure described with reference to FIGS. 12A to 12D.

FIGS. 16A, 16B, 16C, 16D, 16E, 16F, 16G, and 16H illustrate an example of an integration process according to a comparative example. The comparative example of FIGS. 16A to 16H may be a part of a V-NAND device fabrication process according to a conventional process.

In step of FIG. 16A, a stack in which silicon nitride thin films 301 and silicon oxide thin films 201 are alternately and repeatedly stacked may be provided. A predetermined opening, for example, a hole or a trench, may be formed in a part of the stack. In the present drawing, for the sake of convenience, only a stack portion disposed at one side of the opening is shown.

In step of FIG. 16B, the silicon oxide thin films 201 may be partially recessed in the thickness direction in the opening. Reference numeral 201a denotes silicon oxide thin films which have been partially recessed in the thickness direction.

In step of FIG. 16C, a polysilicon layer 401 may be formed on the silicon oxide thin films 201a and the silicon nitride thin films 301 in the opening. In step of FIG. 16D, the polysilicon layer 401 may be partially etched in the thickness direction to leave the polysilicon layer 401 substantially only in each of the recessed areas corresponding to the silicon oxide thin film 201a. The remaining polysilicon layers are denoted by reference numeral 401a.

In step of FIG. 16E, a wet oxidation process and a radical oxidation process may be performed. The wet oxidation process may oxidize the polysilicon layers 401a and not the nitrides 301. Here, an oxide (hereinafter referred to as a first oxide) formed by the oxidation of the polysilicon layer 401a is denoted by reference numeral 401b. The nitrides 301 may be partially oxidized by the radical oxidation process. Here, an oxide (hereinafter referred to as a second oxide) oxidized from each of the nitrides 301 is denoted by reference numeral 301a.

A charge trap layer, for example, charge trap nitride (CTN) thin film 501 may be formed in step of FIG. 16F. The CTN thin film 501 may be formed on the first oxide 401b and the second oxide 301a. In step of FIG. 16G, a part of the CTN thin film 501 may be etched to leave a plurality of CTN pattern films 501a disposed between and around a plurality of first oxides 401b. In step of FIG. 16H, a polysilicon layer 601 may be formed on the plurality of first oxides 401b and a plurality of CTN pattern films 501a.

The V-NAND device fabrication process according to the conventional process (comparative example) described with reference to FIG. 16 may be complicated and may be inefficient.

FIGS. 17A, 17B, 17C, 17D, 17E, and 17F illustrate an example of an integration process employing a deposition method (e.g., an area-selective deposition process) according to an example of the present disclosure. The example of FIGS. 17A to 17F may be a part of a V-NAND device fabrication process.

In step of FIG. 17A, a stack in which silicon nitride thin films 302 and silicon oxide thin films 202 are alternately and repeatedly stacked may be provided. A predetermined opening, for example, a hole or a trench may be formed in a part of the stack. In the present drawing, for the sake of convenience, only a stack portion disposed at one side of the opening is shown.

In step of FIG. 17B, a silicon oxide layer 252 may be formed on the side (surface) of each of the silicon oxide thin films 202 in the opening by using an area-selective deposition process according to an example of the present disclosure.

In step of FIG. 17C, blocking oxide layers 302a disposed on both sides of the silicon oxide layer 252 may be formed.

In step of FIG. 17D, a CTN thin film 502 substantially entirely covering the silicon oxide layer 252 and the blocking oxide layers 302a may be formed in the opening.

In step of FIG. 17E, a part of the CTN thin film 502 may be etched to leave a plurality of CTN pattern films 502a disposed between and around the plurality of silicon oxide layers 252.

In step of FIG. 17F, a polysilicon layer 602 may be formed on the plurality of silicon oxide layers 252 and the plurality the CTN pattern films 502a. The result of step of FIG. 17F may have a structure similar to the result of step in the comparative example of FIG. 16H.

In the case of the integration process according to the embodiment described with reference to FIGS. 17A to 17F, it is possible to obtain the technical effect of simplifying the process and enhancing the efficiency compared to the integration process according to the comparative example of FIGS. 16A to 16H.

FIGS. 18A, 18B, 18C, 18D, 18E, and 18F illustrate a device forming process employing a deposition method (e.g., an area-selective deposition process) according to another example of the present disclosure.

In step of FIG. 18A, a stack in which silicon nitride thin films 303 and silicon oxide thin films 203 are alternately and repeatedly stacked may be provided. A predetermined opening, for example, a hole or a trench may be formed in a part of the stack. In the present drawing, for the sake of convenience, only a stack portion disposed at one side of the opening is illustrated.

In step of FIG. 18B, an area-selective deposition process according to an example of the present disclosure may be used to form a first silicon oxide layer 253 on the side surface of each of the silicon oxide thin films 203 in the opening. This may be referred to as a first oxide ASD process.

In step of FIG. 18C, a first silicon nitride layer 353 may be formed on the side surface of each of the silicon nitride thin films 303 in the opening by using a typical selective deposition process. This may be referred to as a first nitride ASD process.

In step of FIG. 18D, an additional silicon oxide layer may be formed on the side surface of each of the first silicon oxide layers 253 by using an area-selective deposition process according to an embodiment. The first silicon oxide layer 253 and the additional silicon oxide layer are collectively shown as a single layer 253a, which is referred to as a second silicon oxide layer 253a. The process of FIG. 18D may be referred to as a second oxide ASD process.

In step of FIG. 18E, an additional silicon nitride layer may be formed on the side surface of the first silicon nitride layer 353 in the open area by using a typical area-selective deposition process. The first silicon nitride layer 353 and the additional silicon nitride layer are collectively shown as a single layer 353a, which is referred to as a second silicon nitride layer 353a. The process of FIG. 18E may be referred to as a second nitride ASD process.

As shown in steps of FIG. 18B to FIG. 18EI, the oxide ASD process and the nitride ASD process may be alternately repeated. Step of FIG. 18F shows the result of repeating the oxide ASD process and the nitride ASD process by N times. Here, reference numeral 253n denotes an Nth silicon oxide layer, and reference numeral 353n denotes an Nth silicon nitride layer.

FIGS. 19A, 19B, 19C, 19D, 19E, and 19F are plan views, i.e., top-views of respective process steps, according to an example of the present disclosure. Each of the steps in FIGS. 19A to 19F may correspond to each of the steps in FIGS. 18A to 18F, respectively. FIGS. 19A to 18F show the entire opening, for example, a hole or a trench.

As described with reference to FIGS. 18A to 18F and 19A to 19F, using a deposition method (e.g., an area-selective deposition process) according to an embodiment can easily reduce the critical dimension (CD) of a hole or trench area formed in a three-dimensional stacked structure. The hole area may be referred to as, for example, a plug hole area.

According to the above-described embodiments of the present disclosure, it is possible to implement an "area-selective deposition method" which overcomes the limitations and problems of conventional top-down type deposition and device fabrication process and which can increase the degree of freedom of the deposition and patterning method for various substrate structures including a three-dimensional structure. In particular, the application of the "area-selective deposition method" according to various examples of the present disclosure can be advantageous for fabricating high aspect ratio/high integrated devices, especially for fabricating three-dimensional V-NAND devices, and can increase the degree of freedom of the device integration process.

The area-selective deposition method according to embodiments may be usefully applied to the manufacture of a variety of electronic devices, including a three-dimensional V-NAND device. For example, the area-selective deposition method according to embodiments may be usefully applied to patterned discontinuous CTN formation and CD reduction of an open area, for example, a hole or a trench during the fabrication of a three-dimensional V-NAND device. In addition, the area-selective deposition method according to the various examples of the present disclosure can be applied to the fabrication of V-NAND devices as well as various other electronic devices. For example, area-selective deposition method according to the various examples of the present disclosure may be applicable to various electronic device fields including NAND, DRAM, transistors, MEMS, CPU, logic device, sensors, and etc.

In the case of a three-dimensional NAND flash device, as the distance between Z-axis cells decreases while ON pitch scaling continues, problems of interference between adjacent cells occur, and CTN isolation may be desirable. Since it may be difficult to apply an existing patterning technique (i.e., a lithography process) inside a plug hole, a new bottom-up type 3D patterning process may be desirable. The area-selective deposition method according to an example of the present disclosure can coincide with the technical development direction of such three-dimensional NAND flash, and can provide a bottom-up type three-dimensional patterning process that is required in the field of three-dimensional NAND flash. Accordingly, ultra-precision area-selective deposition/patterning methods according to embodiments of the present disclosure are expected to work advantageously with next generation NAND flash device development and related market preoccupation. The application field of the embodiments of the present disclosure is not limited to the three-dimensional NAND field, but encompass other various electronic device fields.

Additionally, according to embodiments of the present disclosure, it is possible to implement an area-selective deposition method that can increase the selectivity of thin film deposition by using, for example, an aminosilane-based inhibitor material. Furthermore, according to embodiments of the present disclosure, it is possible to implement an area-selective deposition method capable of easily and selectively forming a thin film on a first material surface (e.g., a surface of the silicon oxide portion) or a second material surface (e.g., a surface of a silicon nitride portion) different from the first material surface.

While some embodiments of the present disclosure have been disclosed herein, and although specific terms have been used, they are used merely in a general sense to easily describe the technical content of the present disclosure and to aid in understanding the present disclosure, and are not intended to limit the scope of the present disclosure. Other modifications based on the technical spirit of the present disclosure, in addition to the embodiments disclosed herein, are possible. Those skilled in the art will appreciate that a deposition method (e.g., the area-selective deposition method) according to the embodiments described above with reference to related figures and the electronic device manufacturing method using the same may be variously substituted, changed, and modified without departing from the technical spirit of the present disclosure. Therefore, the scope of the present disclosure should not be defined by the described embodiments but by the technical spirit described in claims.

DESCRIPTION OF REFERENCE NUMERALS
OF MAJOR PARTS IN THE DRAWINGS

100: substrate
200, 205, 210: silicon oxide areas
250, 255, 260, 270, 280: silicon oxide layers
300, 305, 310 silicon nitride areas
360: silicon nitride layer
P10: Silicon precursor
P15: precursor material
P20: inhibitor substance
R10, R15: oxygen sources
H10: opening

What is claimed is:

1. A deposition method comprising:
providing a structure, which comprises a silicon oxide portion and a silicon nitride portion that have different surface characteristics from each other; and
performing an atomic layer deposition (ALD) process in a reactor provided with the structure to selectively form a silicon oxide layer on the silicon oxide portion,
wherein the ALD process comprises:
a first supply step of supplying a silicon precursor into the reactor to selectively adsorb the silicon precursor to a surface of the silicon oxide portion;
a first purge step of purging the reactor;
a second supply step of supplying an inhibitor material into the reactor to selectively adsorb the inhibitor material to a surface of the silicon nitride portion;
a second purge step of purging the reactor;
a third supply step of supplying an oxygen-containing source into the reactor; and
a third purge step of purging the reactor.

2. The method of claim 1, wherein the providing of the structure comprises performing surface treatment on the silicon oxide portion and the silicon nitride portion to form a first functional group on the surface of the silicon oxide portion and a second functional group on the surface of the silicon nitride portion, and the second functional group is different from the first functional group.

3. The method of claim 2, wherein the first functional group comprises an —OH functional group, and the second functional group comprises an —NH$_2$ functional group.

4. The method of claim 2, wherein the surface treatment is performed with a solution comprising hydrogen fluoride (HF).

5. The method of claim 1, wherein the silicon precursor is an aminosilane-based silicon precursor, and optionally, the aminosilane-based silicon precursor comprises diisopropylaminosilane (DIPAS).

6. The method of claim 1, wherein the silicon precursor is selectively adsorbed to the surface of the silicon oxide portion to form SiH$_3$ on the surface of the silicon oxide portion.

7. The method of claim 1, wherein the inhibitor material is an aminosilane-based inhibitor material, and optionally, the aminosilane-based inhibitor material comprises N,N-diethylamino trimethylsilane (DEATMS).

8. The method of claim 1, wherein the inhibitor material is selectively adsorbed to the surface of the silicon nitride portion to form Si(CH$_3$)$_3$ on the surface of the silicon nitride portion.

9. The method of claim 1, wherein the oxygen-containing source comprises ozone (O$_3$).

10. The method of claim 1, wherein a process temperature of the ALD process is 150° C. or lower.

11. The method of claim 1, wherein, the performing of the ALD process comprises:
sequentially performing the first supply step, the first purge step, the second supply step, the second purge step, the third supply step, and the third purge step in a first cycle of the ALD process; and
performing the first supply step, the first purge step, the third supply step, and the third purge step in sequence in each of one or more cycles after the first cycle.

12. The method of claim 1, wherein the structure comprises a stack in which silicon oxide thin films and silicon nitride thin films are alternately and repeatedly stacked on a top surface of a substrate,
wherein the stack is provided with at least one opening formed in a direction in which the silicon oxide thin films and the silicon nitride thin films are stacked, and
wherein the silicon oxide layer is selectively formed from a side surface of each of the silicon oxide thin films, which is exposed to the opening.

13. The method of claim 1, wherein the silicon oxide portion is a first silicon oxide portion and the silicon nitride portion is a first silicon nitride portion, and the structure further comprises a second silicon oxide portions and a second silicon nitride portions, and
wherein the first and second silicon oxide portions and the first and second silicon nitride portions are arranged on a top surface of a substrate in a direction parallel to the top surface of the substrate.

14. The method of claim 1, further comprising removing the inhibitor material adsorbed to the surface of the silicon nitride portion.

15. A method for manufacturing an electronic device, comprising:
providing a structure, which comprises a silicon oxide portion and a silicon nitride portion that have different surface characteristics from each other; and
forming a material film on the structure by using an atomic layer deposition (ALD) process in a reactor provided with the structure to selectively form a silicon oxide layer on the silicon oxide portion,
wherein the ALD process comprises:
a first supply step of supplying a silicon precursor into the reactor to selectively adsorb the silicon precursor to a surface of the silicon oxide portion;
a first purge step of purging the reactor;
a second supply step of supplying an inhibitor material into the reactor to selectively adsorb the inhibitor material to a surface of the silicon nitride portion;
a second purge step of purging the reactor;
a third supply step of supplying an oxygen-containing source into the reactor; and
a third purge step of purging the reactor.

16. The method of claim 15, wherein the electronic device comprises a three-dimensional V-NAND device.

17. A deposition method comprising:
providing a structure, which comprises a silicon oxide portion and a silicon nitride portion that have different surface characteristics from each other; and performing an atomic layer deposition (ALD) process in a reactor provided with the structure to selectively form a silicon oxide layer on the silicon nitride portion, wherein the ALD process comprises:

a first supply step of supplying an aminosilane-based precursor material into the reactor to adsorb the precursor material to both a surface of the silicon oxide portion and a surface of the silicon nitride portion;

a first purge step of purging the reactor;

a second supply step of supplying an oxygen-containing source into the reactor to selectively cause a silicon oxide formation reaction on the silicon nitride portion; and a second purge step of purging the reactor.

18. The method of claim 17, wherein the providing of the structure comprises performing surface treatment on the silicon oxide portion and the silicon nitride portion to form a first functional group on the surface of the silicon oxide portion and a second functional group on the surface of the silicon nitride portion, and the second functional group is different from the first functional group.

19. The method of claim 18, wherein the first functional group comprises an —OH functional group, and the second functional group comprises an —NH$_2$ functional group.

20. The method of claim 17, wherein the aminosilane-based precursor material comprises N,N-diethylamino trimethylsilane (DEATMS).

21. The method of claim 17, wherein the aminosilane-based precursor material is adsorbed to the surface of the silicon oxide portion to form O—Si—(CH$_3$)$_3$ and is adsorbed to the surface of the silicon nitride portion to form N—Si—(CH$_3$)$_3$.

22. The method of claim 17, wherein a process temperature of the ALD process is 150° C. or lower.

23. The method of claim 17, wherein the aminosilane-based precursor material is a first aminosilane-based precursor material and the oxygen-containing source is a first oxygen-containing source, the ALD process further comprising:

a third supply step of supplying a second aminosilane-based precursor material into the reactor;

a third purge step of purging the reactor;

a fourth supply step of supplying a second oxygen-containing source into the reactor; and a fourth purge step of purging the reactor, wherein the performing of the ALD process comprises:

sequentially performing the first supply step, the first purge step, the second supply step, and the second purge step in in a first cycle of the ALD process; and performing the third supply step, the third purge step, the fourth supply step, and the fourth purge step in sequence in each of one or more cycles after the first cycle.

24. The method of claim 23, wherein the second precursor material comprises diisopropylaminosilane (DIPAS).

25. A method for manufacturing an electronic device, comprising:

providing a structure, which comprises a silicon oxide portion and a silicon nitride portion that have different surface characteristics; and forming a material film on the structure by using an atomic layer deposition (ALD) process in a reactor provided with the structure to selectively form a silicon oxide layer on the silicon nitride portion, wherein the ALD process comprises:

a first supply step of supplying an aminosilane-based precursor material into the reactor to adsorb the precursor material to both a surface of the silicon oxide portion and a surface of the silicon nitride portion;

a first purge step of purging the reactor;

a second supply step of supplying an oxygen-containing source into the reactor to selectively cause a silicon oxide formation reaction on the silicon nitride portion; and a second purge step of purging the reactor.

26. The method of claim 25, wherein the electronic device comprises a three-dimensional V-NAND device.

* * * * *